(12) United States Patent
Cantoro et al.

(10) Patent No.: US 10,418,448 B2
(45) Date of Patent: Sep. 17, 2019

(54) SEMICONDUCTOR DEVICES INCLUDING FIELD EFFECT TRANSISTORS AND METHODS OF FORMING THE SAME

(71) Applicant: Samsung Electronics Co., Ltd., Suwon-si (KR)

(72) Inventors: Mirco Cantoro, Suwon-si (KR); Zhenhua Wu, Suwon-si (KR); Krishna Bhuwalka, Suwon-si (KR); Sangsu Kim, Yongin-si (KR); Shigenobu Maeda, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 15/591,405

(22) Filed: May 10, 2017

(65) Prior Publication Data

US 2017/0243942 A1 Aug. 24, 2017

Related U.S. Application Data

(62) Division of application No. 14/823,229, filed on Aug. 11, 2015.

(30) Foreign Application Priority Data

Nov. 17, 2014 (KR) .................. 10-2014-0159871

(51) Int. Cl.
*H01L 29/267* (2006.01)
*H01L 27/092* (2006.01)
(Continued)

(52) U.S. Cl.
CPC ...... *H01L 29/267* (2013.01); *H01L 21/02524* (2013.01); *H01L 21/02538* (2013.01); *H01L 21/823412* (2013.01); *H01L 21/823431* (2013.01); *H01L 21/823807* (2013.01); *H01L 21/823821* (2013.01);
(Continued)

(58) Field of Classification Search
CPC ............. H01L 29/267; H01L 21/02524; H01L 21/02538; H01L 21/823412; H01L 21/823807; H01L 21/823878; H01L 21/088; H01L 27/092; H01L 29/0642; H01L 29/1054; H01L 29/1079;
(Continued)

(56) References Cited

U.S. PATENT DOCUMENTS 6,465,815 B2 10/2002 Liu et al.
7,842,587 B2 11/2010 Passlack et al.
(Continued)

OTHER PUBLICATIONS

Bae, Roll-To-Roll Production of 30-Inch Graphene Films for Transparant Electrodes, Nature Nanotechnology Letters Published Online: Jun. 20, 2010, pp. 1-6.
(Continued)

*Primary Examiner* — Dzung Tran
(74) *Attorney, Agent, or Firm* — Onello & Mello, LLP

(57) ABSTRACT

A semiconductor device includes an active pattern provided on a substrate and a gate electrode crossing over the active pattern. The active pattern includes a first buffer pattern on the substrate, a channel pattern on the first buffer pattern, a doped pattern between the first buffer pattern and the channel pattern, and a second buffer pattern between the doped pattern and the channel pattern. The doped pattern includes graphene injected with an impurity.

14 Claims, 41 Drawing Sheets

(51) Int. Cl.
  *H01L 27/088* (2006.01)
  *H01L 29/10* (2006.01)
  *H01L 29/16* (2006.01)
  *H01L 29/165* (2006.01)
  *H01L 21/8234* (2006.01)
  *H01L 21/8238* (2006.01)
  *H01L 21/02* (2006.01)
  *H01L 29/06* (2006.01)

(52) U.S. Cl.
  CPC .... *H01L 21/823878* (2013.01); *H01L 27/088* (2013.01); *H01L 27/0886* (2013.01); *H01L 27/092* (2013.01); *H01L 27/0924* (2013.01); *H01L 29/0642* (2013.01); *H01L 29/1054* (2013.01); *H01L 29/1079* (2013.01); *H01L 29/165* (2013.01); *H01L 29/1606* (2013.01)

(58) Field of Classification Search
  CPC ... H01L 29/29; H01L 29/1606; H01L 29/165; H01L 27/0886; H01L 27/0924
  USPC .......................................................... 257/27
  See application file for complete search history.

(56) References Cited

U.S. PATENT DOCUMENTS

| | | | |
|---|---|---|---|
| 8,084,371 B2 | 12/2011 | Seo et al. | |
| 8,198,707 B2 | 6/2012 | Colombo et al. | |
| 8,310,014 B2 | 11/2012 | Seo et al. | |
| 8,420,987 B2 | 4/2013 | Kim et al. | |
| 8,471,444 B2 | 6/2013 | Van Spijker | |
| 8,480,931 B2 | 7/2013 | Choi et al. | |
| 8,487,356 B2 | 7/2013 | Heo et al. | |
| 8,519,450 B1 | 8/2013 | Zhu | |
| 8,530,886 B2 | 9/2013 | Avouris et al. | |
| 8,563,657 B2 | 10/2013 | Hsiao et al. | |
| 8,568,685 B2 | 10/2013 | Strano et al. | |
| 8,598,634 B1 | 12/2013 | Zhu | |
| 8,614,141 B2 | 12/2013 | Avouris et al. | |
| 8,617,941 B2 | 12/2013 | Farmer et al. | |
| 8,633,729 B1 | 1/2014 | Brown | |
| 8,637,851 B2 | 1/2014 | Cho et al. | |
| 8,648,342 B2 | 2/2014 | Kim et al. | |
| 8,652,959 B2 | 2/2014 | Bennett et al. | |
| 8,680,514 B2 | 3/2014 | Park et al. | |
| 8,735,242 B2 | 5/2014 | Zhu | |
| 8,742,398 B2 | 6/2014 | Klem et al. | |
| 8,742,400 B2 | 6/2014 | Seo et al. | |
| 8,748,871 B2 | 6/2014 | Avouris et al. | |
| 8,754,503 B2 | 6/2014 | Zhu et al. | |
| 8,815,739 B2 | 8/2014 | Krivokapic et al. | |
| 8,816,582 B2 | 8/2014 | Nutzel et al. | |
| 8,873,131 B2 | 10/2014 | Han et al. | |
| 8,912,530 B2 | 12/2014 | Yang et al. | |
| 8,927,963 B2 | 1/2015 | Huo et al. | |
| 2007/0131970 A1* | 6/2007 | Mittereder | H01L 29/66462 257/194 |
| 2009/0026501 A1 | 1/2009 | Maher et al. | |
| 2010/0148153 A1 | 6/2010 | Hudait et al. | |
| 2010/0258787 A1* | 10/2010 | Chae | H01L 29/0673 257/39 |
| 2010/0307589 A1 | 12/2010 | Choi et al. | |
| 2010/0326524 A1 | 12/2010 | Ihn et al. | |
| 2011/0042650 A1 | 2/2011 | Avouris et al. | |
| 2011/0114918 A1* | 5/2011 | Lin | H01L 29/1606 257/24 |
| 2011/0121264 A1 | 5/2011 | Choi et al. | |
| 2011/0156007 A1* | 6/2011 | Otsuji | H01L 21/8213 257/29 |
| 2011/0220865 A1 | 9/2011 | Miyata et al. | |
| 2011/0269629 A1 | 11/2011 | Giustino et al. | |
| 2011/0291068 A1 | 12/2011 | Kobayashi | |
| 2012/0056237 A1 | 3/2012 | Choi et al. | |
| 2012/0070612 A1 | 3/2012 | Lee et al. | |
| 2012/0132516 A1 | 5/2012 | Zimmerman | |
| 2012/0175595 A1* | 7/2012 | Chung | H01L 29/42384 257/29 |
| 2012/0205626 A1 | 8/2012 | Dimitrakopoulos et al. | |
| 2012/2004950 | 8/2012 | Magdassi et al. | |
| 2012/0247543 A1 | 10/2012 | Zehavi | |
| 2012/0261645 A1 | 10/2012 | Cho et al. | |
| 2012/0325200 A1 | 12/2012 | Kolpak et al. | |
| 2013/0048951 A1 | 1/2013 | Heo et al. | |
| 2013/0048948 A1 | 2/2013 | Heo et al. | |
| 2013/0062591 A1 | 3/2013 | Jun et al. | |
| 2013/0101247 A1 | 4/2013 | Cho et al. | |
| 2013/0105811 A1 | 5/2013 | Ando et al. | |
| 2013/0119409 A1 | 5/2013 | Zhao | |
| 2013/0134361 A1 | 5/2013 | Lee et al. | |
| 2013/0134864 A1 | 5/2013 | Nutzel et al. | |
| 2013/0139865 A1 | 6/2013 | Lee et al. | |
| 2013/0153860 A1 | 6/2013 | Kim et al. | |
| 2013/0155522 A1 | 6/2013 | Jeong et al. | |
| 2013/0175506 A1 | 7/2013 | Heo et al. | |
| 2013/0177823 A1 | 7/2013 | Nguyen et al. | |
| 2013/0221322 A1 | 8/2013 | Ohlsson | |
| 2013/0240838 A1 | 9/2013 | Radosavljevic et al. | |
| 2013/0248824 A1 | 9/2013 | Kelber | |
| 2013/0313520 A1 | 11/2013 | Pillarisetty et al. | |
| 2013/0313522 A1 | 11/2013 | Nourbakhsh et al. | |
| 2013/0334497 A1 | 12/2013 | Weman et al. | |
| 2014/0002203 A1 | 1/2014 | Liu et al. | |
| 2014/0008616 A1 | 1/2014 | Geim et al. | |
| 2014/0014970 A1 | 1/2014 | Woo et al. | |
| 2014/0045977 A1 | 2/2014 | Hsiao et al. | |
| 2014/0070167 A1 | 3/2014 | Zebarjadi et al. | |
| 2014/0183653 A1* | 7/2014 | Niimi | H01L 29/517 257/369 |
| 2014/0264379 A1 | 9/2014 | Kub et al. | |

OTHER PUBLICATIONS

Czomomaz, Co-Integration of INGAAS N- and SIGE P-MOSFETS Into Digital CMOS Circuits Using Hybrid Dual-Channel Etxoi Substrates, IEDM13, pp. 52-55.
Guo, Graphene Doping: A Review, Insciences J. 2011, 1(2), pp. 80-89.
Kalna, Benchmarking of Scaled INGAAS Implant-Free Nanomosfets, IEEE Transactions on Electron Devices, vol. 55, No. 9, Sep. 2008, pp. 2297-2306.
Yokoyama, CMOS Integration of INGAAS NMOSFETS and GE PMOSFETS With Self-Align Ni-Based Metal SID Using Direct Wafer Bonding, 2011 Symposium on VLSI Technology Digest of Technical Papers, pp. 60-61.
"Semiconductor Devices Including Field Effect Transistors and Methods of Forming the Same" Specification, Drawings and Prosecution History, of U.S. Appl. No. 14/823,229, filed Aug. 11, 2015, by Mirco Cantoro, et al.

* cited by examiner

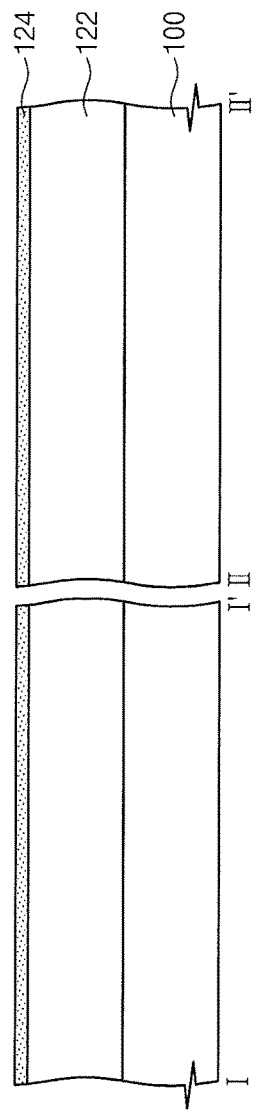
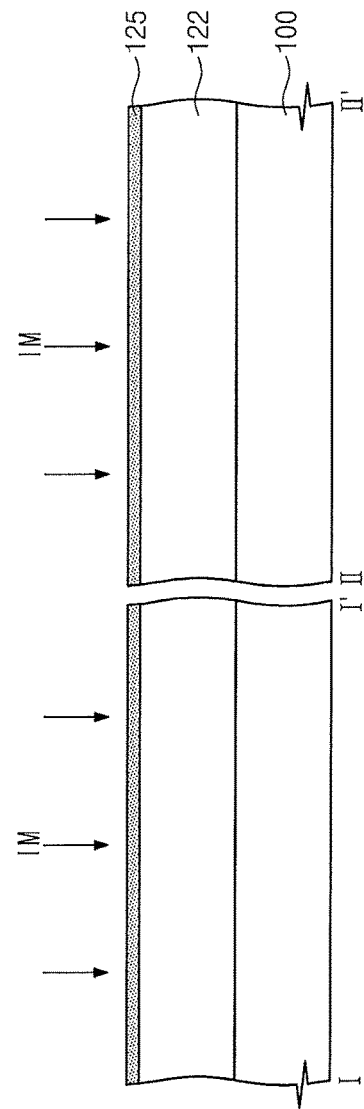

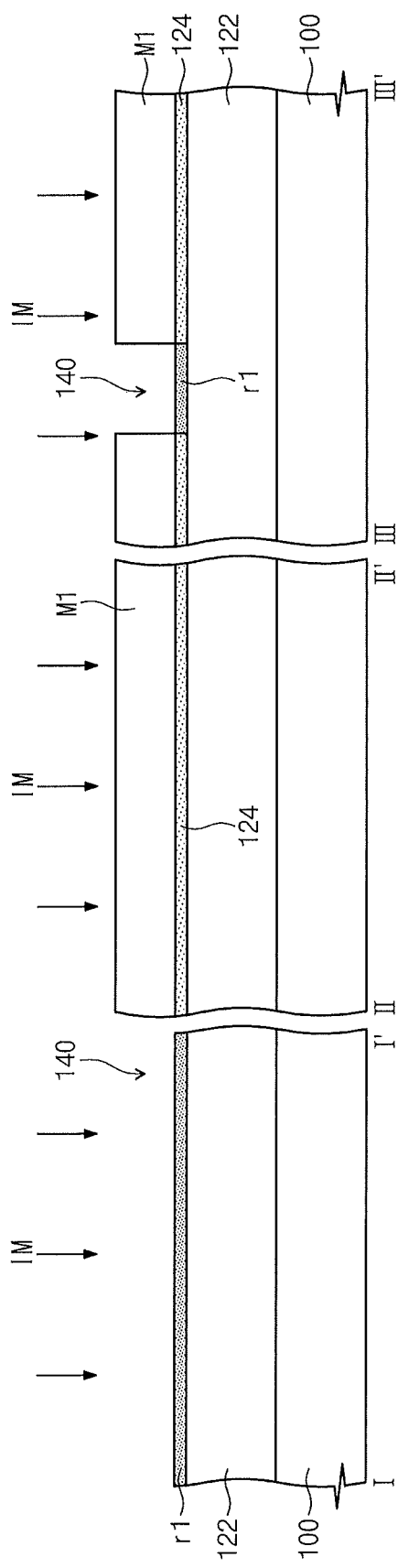

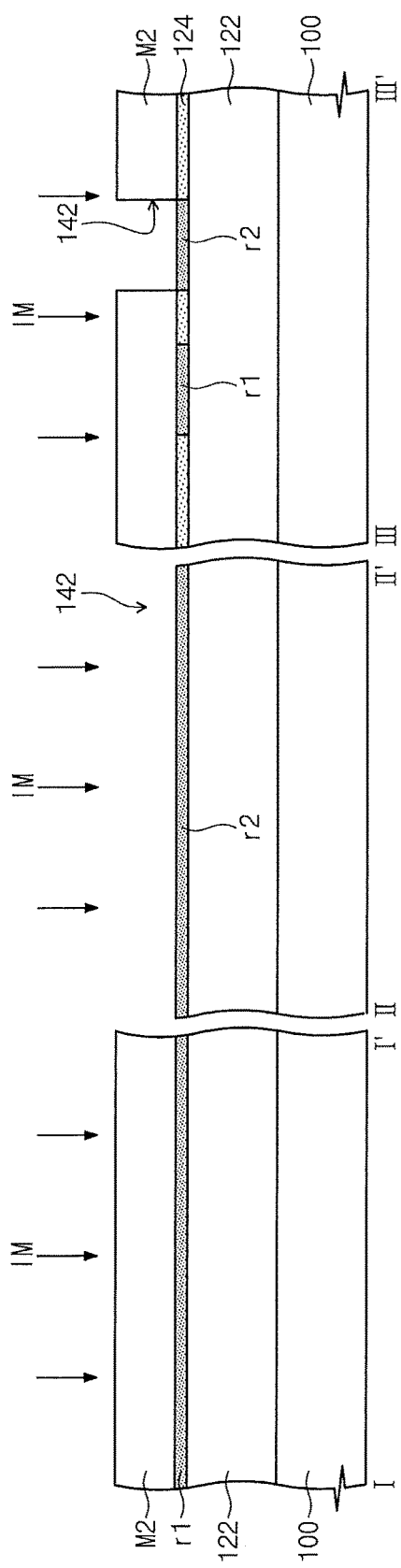

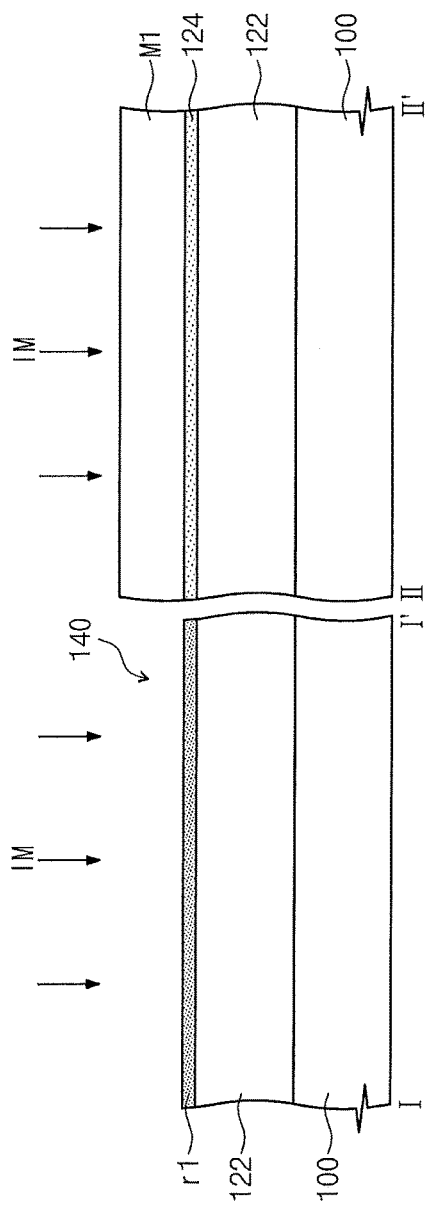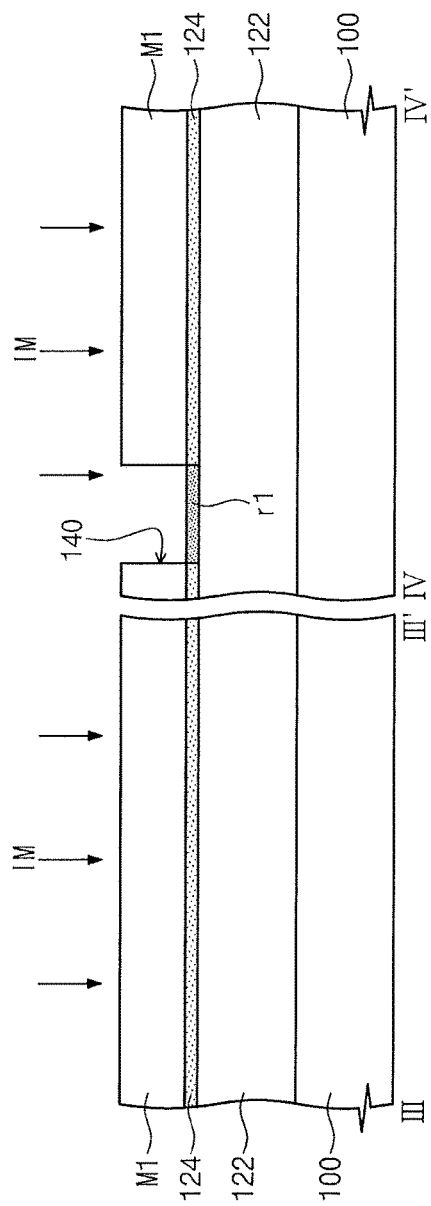

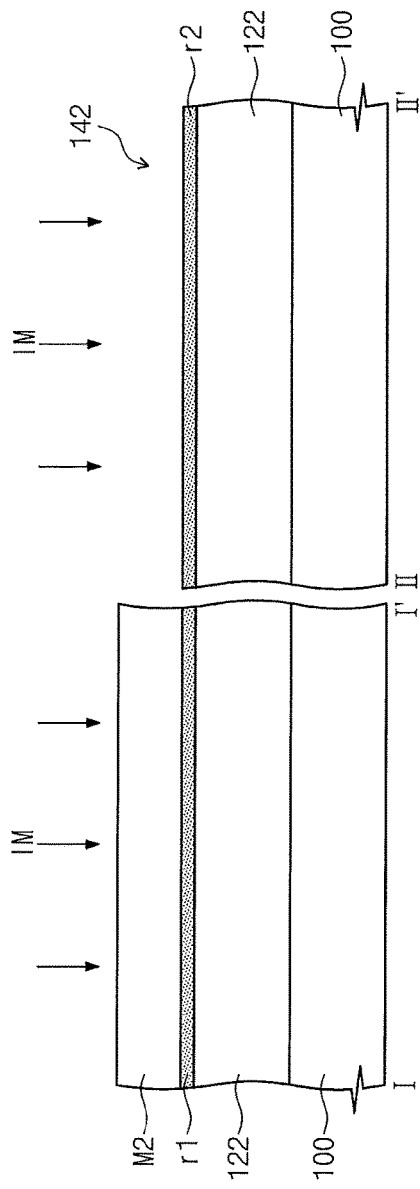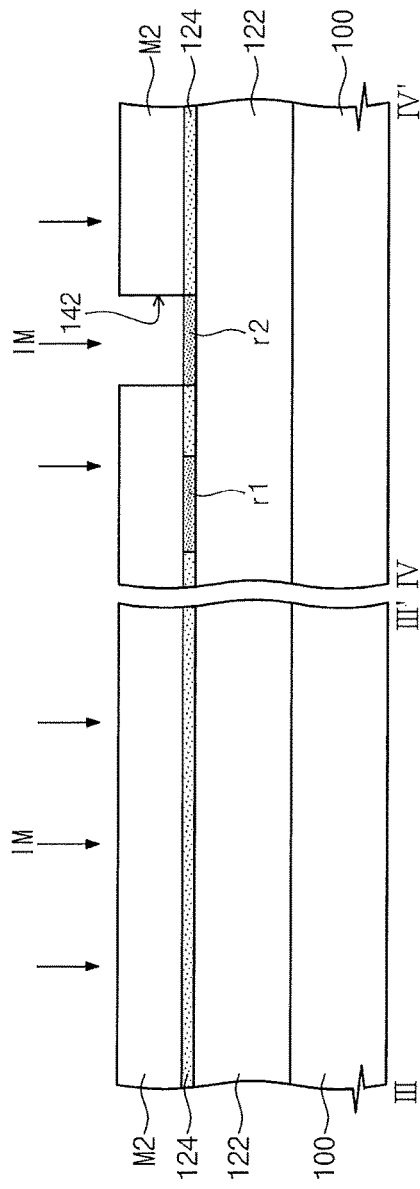

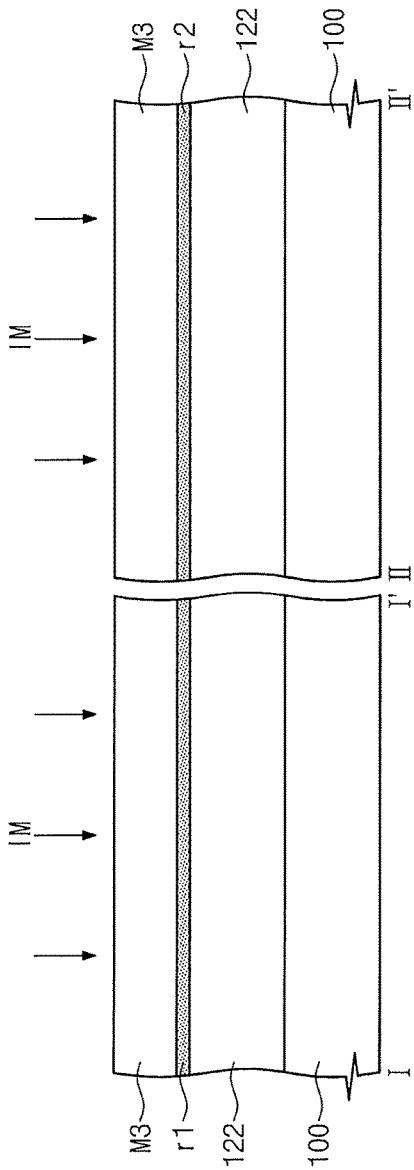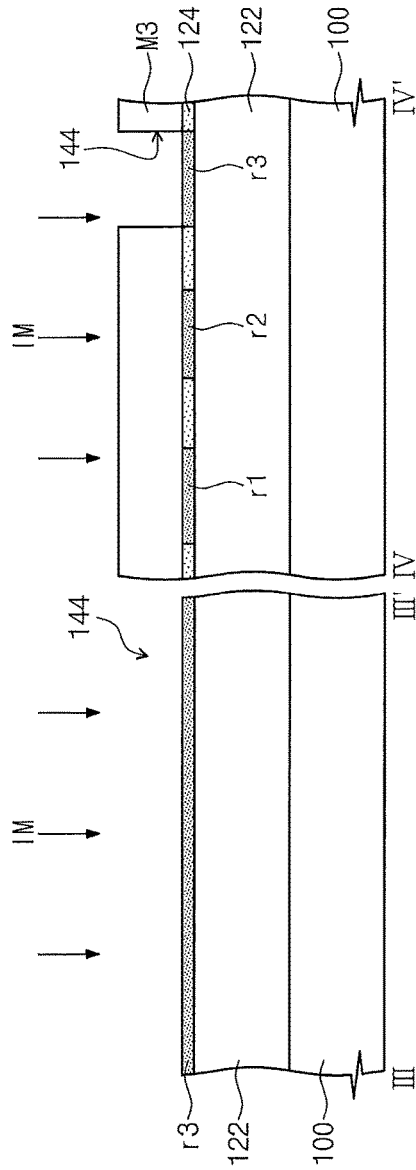

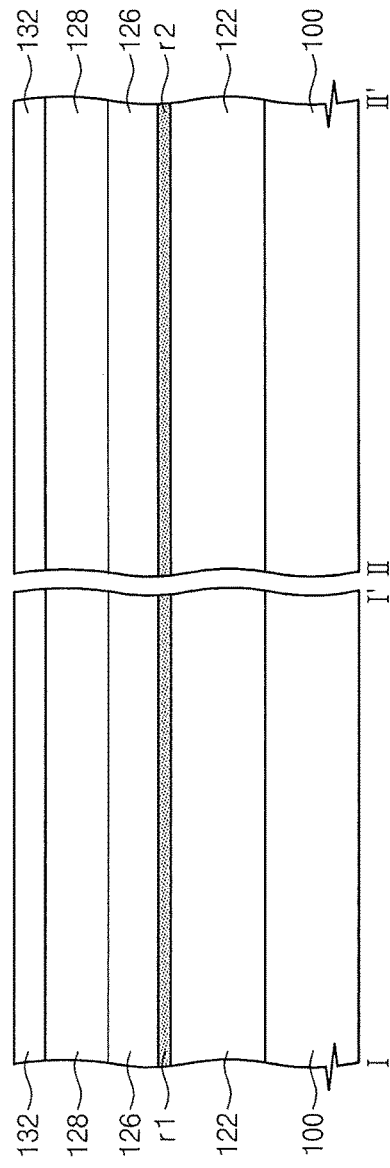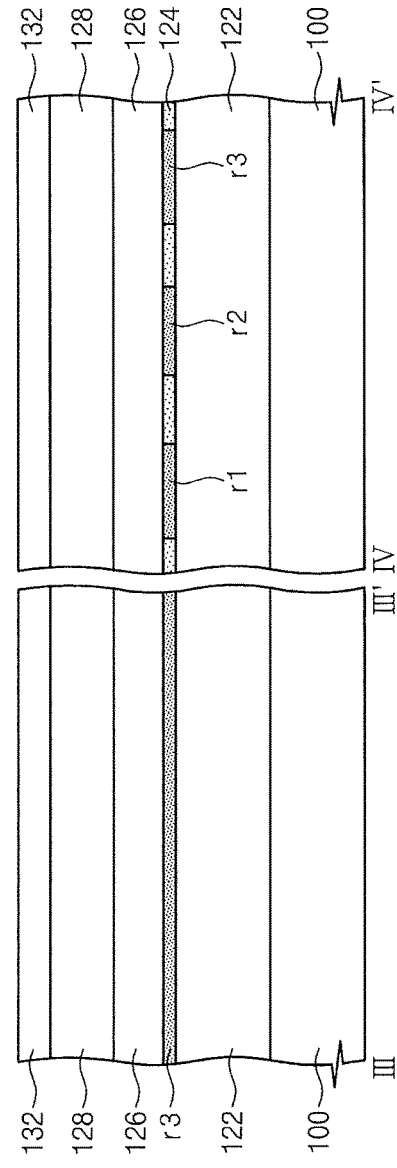

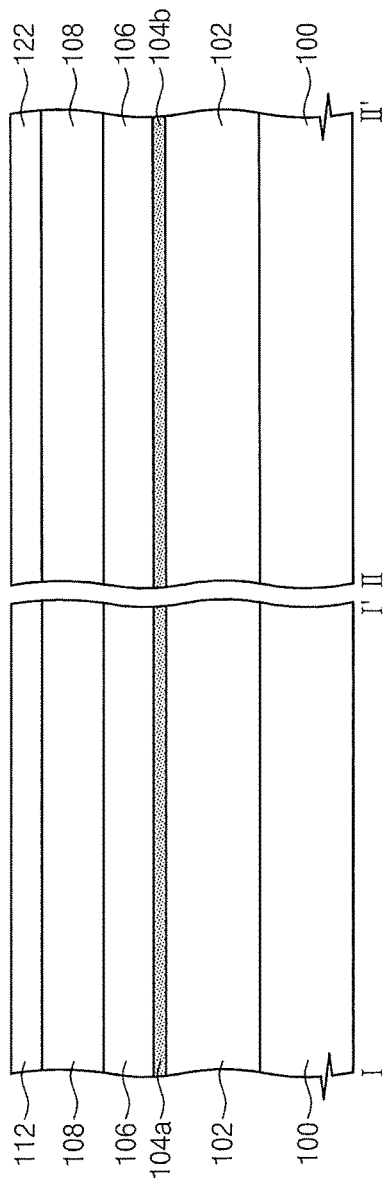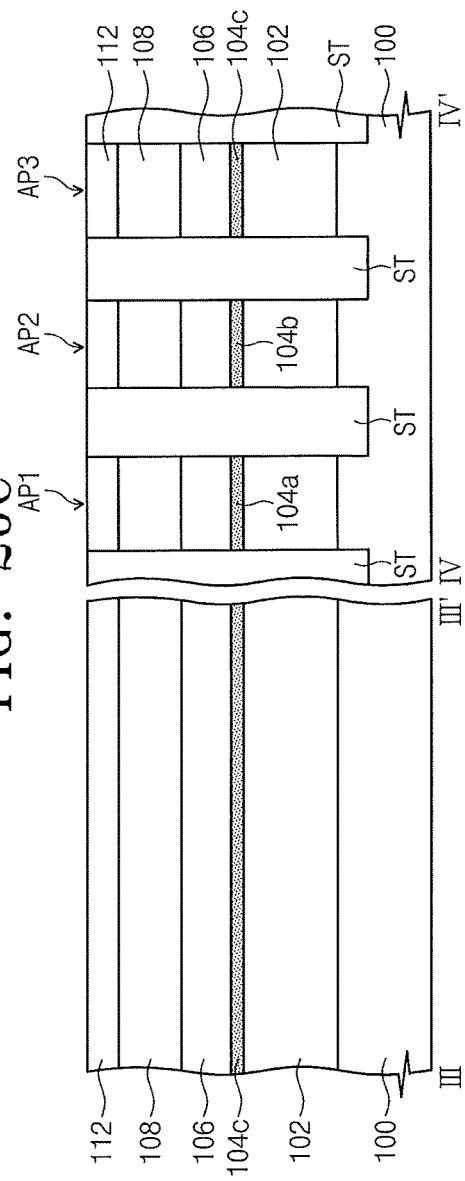

SEMICONDUCTOR DEVICES INCLUDING FIELD EFFECT TRANSISTORS AND METHODS OF FORMING THE SAME

CROSS-REFERENCE TO RELATED APPLICATION

This application is a divisional application of U.S. patent application Ser. No. 14/823,229, filed on Aug. 11, 2015, which claims the benefit of Korean patent application number 10-2014-0159871, filed on Nov. 17, 2014, in the Korean Intellectual Property Office, the contents of which applications are incorporated herein in their entirety by reference.

BACKGROUND

The inventive concepts relate to semiconductor devices and methods of forming the same. More particularly, the inventive concepts relate to semiconductor devices including field effect transistors and methods of forming the same.

Semiconductor devices are widely used in the electronic industry because of their small sizes, multi-functional characteristics, and/or low manufacture costs. Semiconductor devices may be categorized as any one of semiconductor memory devices storing data, semiconductor logic devices processing operations of logical data, and hybrid semiconductor device having both the function of the semiconductor memory devices and the function of the semiconductor logic devices. High-reliable, high-speed, and/or multi-functional semiconductor devices have been increasingly demanded. To satisfy these demands, structures of semiconductor devices have been complicated and semiconductor devices have been highly integrated.

SUMMARY

Exemplary embodiments in accordance with principles of inventive concepts may provide semiconductor devices capable of improving operating characteristics and reliability and methods of forming the same.

Exemplary embodiments in accordance with principles of inventive concepts may also provide semiconductor devices capable of easily providing semiconductor components that are formed of the same channel material and have conductivity types different from each other and methods of forming the same.

Exemplary embodiments in accordance with principles of inventive concepts may also provide semiconductor devices capable of easily providing semiconductor components that are formed of the same channel material and have threshold voltages different from each other and methods of forming the same.

In exemplary embodiments in accordance with principles of inventive concepts, a semiconductor device may include: an active pattern provided on a substrate; and a gate electrode provided on the active pattern and intersecting the active pattern. The active pattern may include: a first buffer pattern on the substrate; a channel pattern on the first buffer pattern; a doped pattern between the first buffer pattern and the channel pattern; and a second buffer pattern between the doped pattern and the channel pattern. The doped pattern may include graphene injected with an impurity.

In exemplary embodiments in accordance with principles of inventive concepts, the doped pattern may have a conductivity type of a P-type or an N-type.

In exemplary embodiments in accordance with principles of inventive concepts, the doped pattern may provide extra carriers to the channel pattern.

In exemplary embodiments in accordance with principles of inventive concepts, an impurity concentration of the doped pattern may be higher than $1 \times 10^6 /cm^2$ and equal to or lower than $1 \times 10^{12} /cm^2$.

In exemplary embodiments in accordance with principles of inventive concepts, the doped pattern may have a crystal structure formed by substituting the impurity for some of carbon atoms of the graphene.

In exemplary embodiments in accordance with principles of inventive concepts, the first buffer pattern and the second buffer pattern may include the same material.

In exemplary embodiments in accordance with principles of inventive concepts, the active pattern may further include: a barrier pattern on the channel pattern. The channel pattern may be disposed between the second buffer pattern and the barrier pattern. The channel pattern may include a material of which an energy band gap is smaller than those of the second buffer pattern and the barrier pattern.

In exemplary embodiments in accordance with principles of inventive concepts, the channel pattern may include a III-V group compound.

In exemplary embodiments in accordance with principles of inventive concepts, the semiconductor device may further include: a device isolation layer provided on the substrate to define the active pattern. The active pattern may include an upper portion exposed by the device isolation layer, and a height of a top surface of the device isolation layer may be lower than a height of a bottom surface of the doped pattern.

In exemplary embodiments in accordance with principles of inventive concepts, the upper portion of the active pattern may be defined as an active fin. The gate electrode may cover a top surface and both sidewalls of the active fin and may extend onto the top surface of the device isolation layer.

In exemplary embodiments in accordance with principles of inventive concepts, the active pattern may include a plurality of active patterns. The gate electrode may intersect the plurality of active patterns, and the doped patterns of the plurality of the active patterns may have the same conductivity type.

In exemplary embodiments in accordance with principles of inventive concepts, a semiconductor device may include: a first active pattern and a second active pattern spaced apart from each other on a substrate; and a first transistor and a second transistor comprising the first active pattern and the second active pattern, respectively. Each of the first and second active patterns may include: a first buffer pattern on the substrate; a channel pattern on the first buffer pattern; a doped pattern between the first buffer pattern and the channel pattern; and a second buffer pattern between the doped pattern and the channel pattern. The doped pattern may include graphene injected with an impurity.

In exemplary embodiments in accordance with principles of inventive concepts, a conductivity type of the doped pattern of the first active pattern may be different from that of the doped pattern of the second active pattern.

In exemplary embodiments in accordance with principles of inventive concepts, the channel pattern of the first active pattern may include the same material as the channel pattern of the second active pattern.

In exemplary embodiments in accordance with principles of inventive concepts, the channel patterns of the first and second active patterns may include a III-V group compound.

In exemplary embodiments in accordance with principles of inventive concepts, the doped pattern of the first active pattern may have a P-type when the first transistor is a PMOS field effect transistor. The doped pattern of the second active pattern may have an N-type when the second transistor is an NMOS field effect transistor.

In exemplary embodiments in accordance with principles of inventive concepts, the doped pattern of the first active pattern may have the same conductivity type as the doped pattern of the second active pattern, and an impurity concentration of the doped pattern of the first active pattern may be different from an impurity concentration of the doped pattern of the second active pattern.

In exemplary embodiments in accordance with principles of inventive concepts, the channel pattern of the first active pattern may include the same material as the channel pattern of the second active pattern.

In exemplary embodiments in accordance with principles of inventive concepts, the channel patterns of the first and second active patterns may include a III-V group compound.

In exemplary embodiments in accordance with principles of inventive concepts, the first transistor may have the same conductivity type as the second transistor, and a threshold voltage of the first transistor may be different from a threshold voltage of the second transistor.

In exemplary embodiments in accordance with principles of inventive concepts, the doped pattern may provide extra carriers to the channel pattern.

In exemplary embodiments in accordance with principles of inventive concepts, the first transistor and the second transistor may share one gate electrode. The one gate electrode may be provided on the substrate to intersect the first active pattern and the second active pattern.

In exemplary embodiments in accordance with principles of inventive concepts, a method of forming a semiconductor device may include: forming a first buffer layer on a substrate; providing a graphene layer onto the first buffer layer; injecting the graphene layer with an impurity; forming a second buffer layer on the graphene layer injected with the impurity; forming a channel layer on the second buffer layer; sequentially patterning the channel layer, the second buffer layer, the graphene layer injected with the impurity, and the first buffer layer to form an active pattern protruding in a direction perpendicular to a top surface of the substrate; and forming a gate electrode intersecting the active pattern. The graphene layer injected with the impurity may provide extra carriers to the channel layer.

In exemplary embodiments in accordance with principles of inventive concepts, injecting the graphene layer with the impurity may include: injecting a portion of the graphene layer with a first impurity to form a first doped region having a first conductivity type; and injecting another portion of the graphene layer with a second impurity to form a second doped region having a second conductivity type different from the first conductivity type. The active pattern may include a first active pattern including the first doped region and a second active pattern including the second doped region.

In exemplary embodiments in accordance with principles of inventive concepts, injecting the graphene layer with the impurity may include: injecting a portion of the graphene layer with a first impurity to form a first doped region; and injecting another portion of the graphene layer with a second impurity to form a second doped region. The first doped region may have the same conductivity type as the second doped region, and a concentration of the first impurity in the first doped region may be different from a concentration of the second impurity in the second doped region. The active pattern may include a first active pattern including the first doped region and a second active pattern including the second doped region.

In exemplary embodiments in accordance with principles of inventive concepts, providing the graphene layer onto the first buffer layer may include: forming the graphene layer on a support substrate; and transferring the graphene layer from the support substrate onto the first buffer layer.

In exemplary embodiments in accordance with principles of inventive concepts, forming the second buffer layer may include: forming the second buffer layer on a support substrate, the second buffer layer having a first surface being in contact with the support substrate and a second surface opposite to the first surface; providing the second buffer layer and the support substrate onto the graphene layer injected with the impurity such that the second surface of the second buffer layer is in contact with the graphene layer injected with the impurity; injecting hydrogen ions into the second buffer layer to form an interface; and physically removing the support substrate and a portion of the second buffer layer by using the interface. The second buffer layer may be divided into an upper portion adjacent to the support substrate and a lower portion adjacent to the graphene layer injected with the impurity by the interface. The upper portion of the second buffer layer may be physically separated and removed from the lower portion of the second buffer layer.

In exemplary embodiments in accordance with principles of inventive concepts, a method of forming a semiconductor device may include: forming a first buffer layer on a substrate; forming a graphene layer doped with an impurity on the first buffer layer; patterning the doped graphene layer to form doped patterns; and forming a second buffer layer by performing a selective epitaxial growth (SEG) process using a top surface of the first buffer layer exposed by the doped patterns as a seed. The second buffer layer may fill a space between the doped patterns and may extend onto top surfaces of the doped patterns.

In exemplary embodiments in accordance with principles of inventive concepts, the doped patterns may be buried under the second buffer layer.

In exemplary embodiments in accordance with principles of inventive concepts, the method may further include: forming a channel layer on the second buffer layer; sequentially patterning the channel layer, the second buffer layer, and the first buffer layer to form active patterns protruding in a direction perpendicular to a top surface of the substrate; and forming a gate electrode intersecting the active patterns. The second buffer layer disposed between the doped patterns may be etched during the patterning process. The active patterns may include the doped patterns, respectively.

In exemplary embodiments in accordance with principles of inventive concepts, a semiconductor device may include: a device isolation layer provided on a substrate to define an active pattern; and a gate electrode provided on the active pattern and intersecting the active pattern. The active pattern may include: a first buffer pattern on the substrate; a channel pattern on the first buffer pattern; a doped pattern between the first buffer pattern and the channel pattern; and a second buffer pattern between the doped pattern and the channel pattern. The doped pattern may provide extra carriers to the channel pattern, and a height of a bottom surface of the device isolation layer may be lower than a height of a bottom surface of the first buffer pattern.

In exemplary embodiments in accordance with principles of inventive concepts a semiconductor device includes a first combination of first and second field effect transistors (FETs) of different conductivity, wherein each FET includes a doped graphene layer between first and second buffer layers and a gate and channel formed thereover; and a second combination of first and second field effect transistors (FETs) of different conductivity, wherein each FET includes a doped graphene layer between first and second buffer layers and a gate and channel.

In exemplary embodiments in accordance with principles of inventive concepts a semiconductor device includes a combination of first and second field effect transistors (FETs) of different conductivity, wherein each FET includes a doped graphene layer between first and second buffer layers and a gate and channel formed thereover that forms a logic circuit.

In exemplary embodiments in accordance with principles of inventive concepts a semiconductor device includes a combination of first and second field effect transistors (FETs) of different conductivity, wherein each FET includes a doped graphene layer between first and second buffer layers and a gate and channel formed thereover that forms a memory circuit.

In exemplary embodiments in accordance with principles of inventive concepts an electronic system includes a semiconductor device that includes a first combination of first and second field effect transistors (FETs) of different conductivity, wherein each FET includes a doped graphene layer between first and second buffer layers and a gate and channel formed thereover; and a second combination of first and second field effect transistors (FETs) of different conductivity, wherein each FET includes a doped graphene layer between first and second buffer layers and a gate and channel.

In exemplary embodiments in accordance with principles of inventive concepts a mobile electronic device includes a semiconductor device that includes a first combination of first and second field effect transistors (FETs) of different conductivity, wherein each FET includes a doped graphene layer between first and second buffer layers and a gate and channel formed thereover; and a second combination of first and second field effect transistors (FETs) of different conductivity, wherein each FET includes a doped graphene layer between first and second buffer layers and a gate and channel.

In exemplary embodiments in accordance with principles of inventive concepts a mobile telephone includes a semiconductor device that includes a first combination of first and second field effect transistors (FETs) of different conductivity, wherein each FET includes a doped graphene layer between first and second buffer layers and a gate and channel formed thereover; and a second combination of first and second field effect transistors (FETs) of different conductivity, wherein each FET includes a doped graphene layer between first and second buffer layers and a gate and channel.

BRIEF DESCRIPTION OF THE DRAWINGS

The inventive concepts will become more apparent in view of the attached drawings and accompanying detailed description.

FIGS. 2 to 5 are cross-sectional views corresponding to the lines I-I' and II-II' of FIG. 1A to illustrate a method of forming a semiconductor device according to a first embodiment of the inventive concepts;

FIGS. 10A to 13A are plan views illustrating a method of forming a semiconductor device according to a second embodiment of the inventive concepts;

FIGS. 10B to 13B are cross-sectional views taken along lines I-I', II-II', and III-III' of FIGS. 10A to 13A, respectively;

FIGS. 16A to 20A are plan views illustrating a method of forming a semiconductor device according to a third embodiment of the inventive concepts;

FIGS. 16B to 20B are cross-sectional views taken along lines I-I' and II-II' of FIGS. 16A to 20A, respectively;

FIGS. 16C to 20C are cross-sectional views taken along lines III-III' and IV-IV' of FIGS. 16A to 20A, respectively;

FIGS. 22A to 26A are plan views illustrating a method of forming a semiconductor device according to a fourth embodiment of the inventive concepts;

FIGS. 22B to 26B are cross-sectional views taken along lines I-I' of FIGS. 22A to 26A, respectively.

DETAILED DESCRIPTION OF THE EMBODIMENTS

Figure 1A:
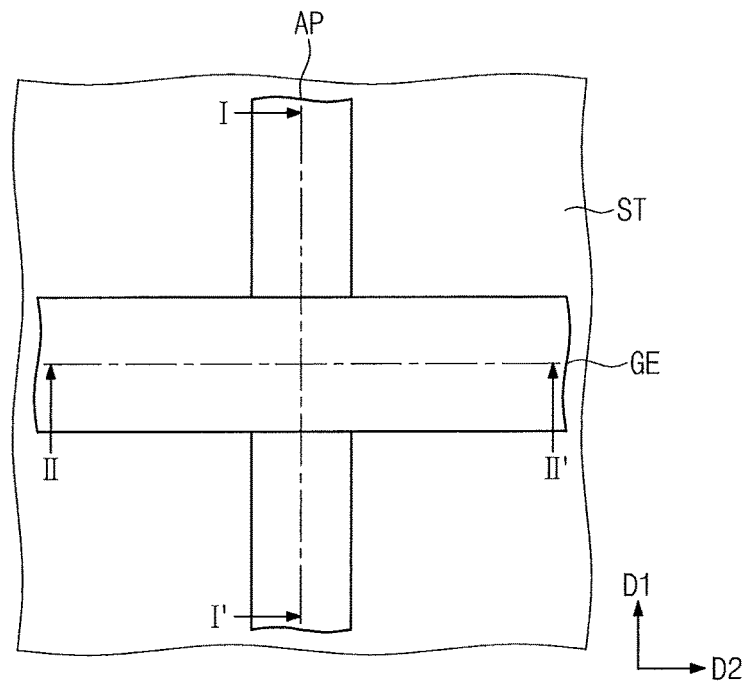
FIG. 1A is a plan view illustrating a semiconductor device according to a first embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein, features of which may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly on" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, an embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting to the scope of the inventive concepts.

It will also be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

Devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

In accordance with principles of inventive concepts, a channel pattern, such as may be employed in a field effect transistor (FET) and electronic devices that include FETs, may include a doped graphene layer. The graphene layer may be a two-dimensional atomic scale hexagonal lattice in which one atom forms each vertex. One carbon atom may be two-dimensionally bonded to three carbon atoms to form a honeycomb shape of graphene and the graphene may be injected or doped with an impurity to form a crystal structure with an impurity substituted for one or more of the carbon atoms of the graphene. The doped graphene may have a thickness of one atomic layer and extend in a two-dimensional pattern, the extent of which is determined by pattern-processes. Devices may include complementary FETs, with devices doped to have different conductivity types (P- or N-type). Doping concentrations may differ between devices as well.

By employing doped graphene in accordance with principles of inventive concepts extra carriers may be available in a semiconductor device's channel(s) and, as a result, the electrical conductivity in the channel may be increased, thereby improving performance of the device and, because the doped graphene layer has a thickness of only one atom, the characteristic dispersion of an associated transistor may be enhanced. Additionally, the high thermal conductivity of the doped graphene improves heat dissipation of an associated device.

A device in accordance with principles of inventive concepts may include a gate formed over a channel which, in turn, is formed over first and second buffer layers sandwiching a doped graphene layer. With different doping, different devices may be P-type or N-type devices that may be combined to form an integrated device.

Figure 1B:
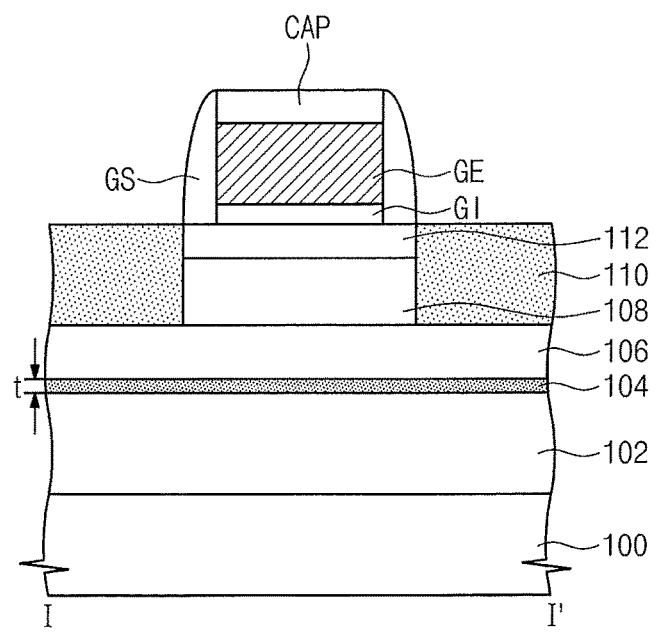
FIGS. 1B and 1C are cross-sectional views taken along lines I-I' and II-II' of FIG. 1A, respectively.
Figure 1C:
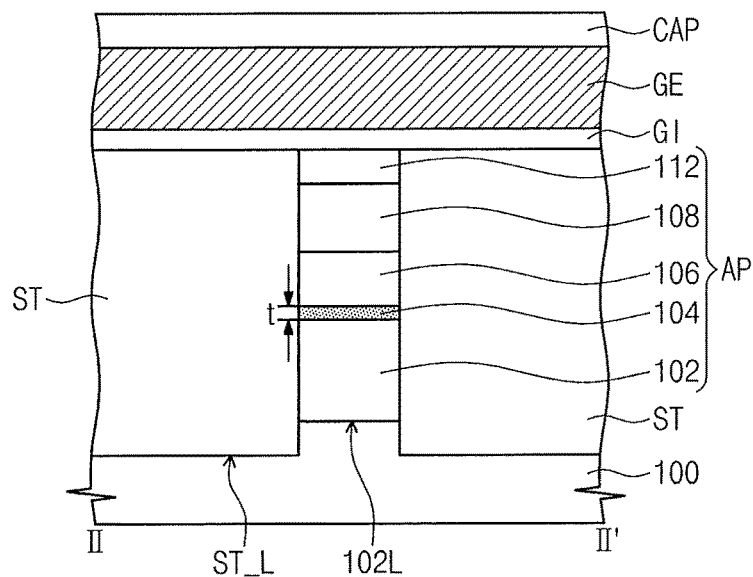
Figure 1D:
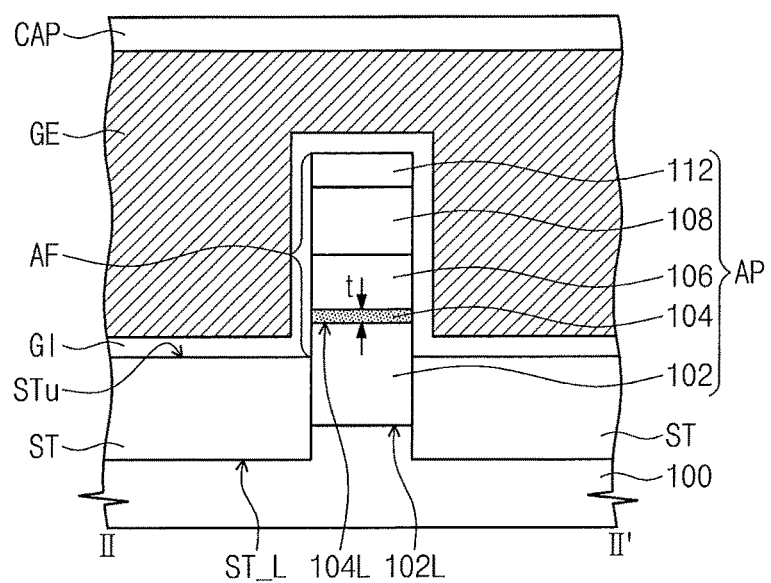
FIG. 1D is a cross-sectional view corresponding to the line II-II' of FIG. 1A to illustrate a semiconductor device according to a modified embodiment of a first embodiment of the inventive concepts.

FIG. 1A is a plan view illustrating a semiconductor device according to a first exemplary embodiment of the inventive concepts. FIGS. 1B and 1C are cross-sectional views taken along lines I-I' and II-II' of FIG. 1A, respectively. FIG. 1D is a cross-sectional view corresponding to the line II-II' of FIG. 1A to illustrate a semiconductor device according to a modified embodiment of a first exemplary embodiment of the inventive concepts.

Referring to FIGS. 1A, 1B, and 1C, a device isolation layer ST may be provided on a substrate 100 to define an active pattern AP. The active pattern AP may have a bar, or elongated rectangular, shape extending in a first direction D1 when viewed from a plan view. Substrate 100 may be a semiconductor substrate formed of silicon, germanium, or silicon-germanium or may be a silicon-on-insulator (SOI) substrate, for example. The device isolation layer ST may include at least one of, for example, an oxide layer, a nitride layer, or an oxynitride layer.

The active pattern AP may include a first buffer pattern 102 disposed on the substrate 100, a channel pattern 108 disposed on the first buffer pattern 102, a doped pattern 104 disposed between the first buffer pattern 102 and the channel pattern 108, and a second buffer pattern 106 disposed between the doped pattern 104 and the channel pattern 108. According to an exemplary embodiment, the active pattern AP may further include a barrier pattern 112 disposed on the channel pattern 108. In such exemplary embodiments, the channel pattern 108 may be disposed between the barrier pattern 112 and the second buffer pattern 106. The doped pattern 104 may be more adjacent to the channel pattern 108 than to the substrate 100. That is, in such exemplary embodiments a distance between the doped pattern 104 and the channel pattern 108 may be smaller than a distance between the doped pattern 104 and the substrate 100.

The first buffer pattern 102 may include silicon (Si), germanium (Ge), silicon-germanium (SiGe), or a III-V group compound. For example, the III-V group compound may include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

The doped pattern 104 may include graphene injected or doped with an impurity. In such exemplary embodiments, one carbon atom may be two-dimensionally bonded to three carbon atoms to constitute a honeycomb shape, and the graphene has a two-dimensional crystal structure having the honeycomb shape. The doped pattern 104 may have a crystal structure formed by substituting the impurity for one (or some) of the carbon atoms of the graphene. The doped pattern 104 may have a thickness t of one atomic layer because of the two-dimensional crystal structure of the graphene.

The doped pattern 104 may have a first conductivity type or a second conductivity type different from the first conductivity type. In exemplary embodiments, the first conductivity type may be a P-type, and the second conductivity type may be an N-type. If the doped pattern 104 has the first conductivity type, the impurity may include, for example, boron (B). Alternatively, if the doped pattern 104 has the second conductivity type, the impurity may include halogen atoms (e.g., nitrogen or fluorine). In some exemplary embodiments, a concentration of the impurity in the doped pattern 104 may be higher than $1 \times 10^6/cm^2$ and equal to or lower than $1 \times 10^{12}/cm^2$.

In a cross-sectional view, the doped pattern 104 may be more adjacent to the channel pattern 108 than to the substrate 100. In such exemplary embodiments, the doped pattern 104 may provide extra carriers to the channel pattern 108. In the graphene, each carbon atom, and other carbon atoms adjacent thereto, may be bonded to each other to form three sigma bonds and one pi bond. One or some of the carbon atoms of the graphene may be replaced with the impurity, so the extra carriers (e.g., holes or electrons) may be generated and then transported to the channel pattern 108 through the pi bond.

The second buffer pattern 106 may include the same material as the first buffer pattern 102. For example, the second buffer pattern 106 may include silicon (Si), germanium (Ge), silicon-germanium (SiGe), or a III-V group compound (e.g., aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb)). According to exemplary embodiments, the second buffer pattern 106 may include the same material as the first buffer pattern 102 and may have the same composition ratio as the first buffer pattern 102. Alternatively, the second buffer pattern 106 may include the same material as the first buffer pattern 102, but the composition ratio of the second buffer pattern 106 may be different from that of the first buffer pattern 102.

The channel pattern 108 may include a material of which an energy band gap is smaller than that of the second buffer pattern 106. In exemplary embodiments, the channel pattern 108 may include a material of which an energy band gap is smaller than those of the first and second buffer patterns 102 and 106. For example, the channel pattern 108 may include silicon (Si), germanium (Ge), silicon-germanium (SiGe), or a III-V group compound (e.g., aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb)). In exemplary embodiments, the first buffer pattern 102, the second buffer pattern 106, and the channel pattern 108 may be formed of the III-V group compounds. In such embodiments, the channel pattern 108 may be formed of the III-V group compound of which an energy band gap is smaller than those of the III-V group compounds of the first and second buffer patterns 102 and 106.

The barrier pattern 112 may include a material of which an energy band gap is greater than that of the channel pattern 108. That is, in such embodiments the channel pattern 108 may include the material of which the energy band gap is smaller than those of the barrier pattern 112 and the second buffer pattern 106, so the channel pattern 108 may have a quantum well structure. The barrier pattern 112 may include silicon (Si), germanium (Ge), silicon-germanium (SiGe), or a III-V group compound. In other exemplary embodiments, the barrier pattern 112 may be omitted.

According to exemplary embodiments, both sidewalls of the active pattern AP may not be exposed by the device isolation layer ST, as illustrated in FIG. 1C. According to other exemplary embodiments, the active pattern AP may include an upper portion (hereinafter, referred to as 'an active fin AF') exposed by the device isolation layer ST, as illustrated in FIG. 1D. That is, in such exemplary embodiments an upper portion of each of the both sidewalls of the active pattern AP may be exposed by the device isolation layer ST. In such embodiments, a height of a top surface STu of the device isolation layer ST may be lower than a height of a bottom surface 104L of the doped pattern 104.

In some exemplary embodiments, a height of a bottom surface ST_L of the device isolation layer ST may be lower than a height of a bottom surface 102L of the first buffer pattern 102, as illustrated in FIGS. 1C and 1D.

A gate electrode GE may be provided to intersect the active pattern AP. The gate electrode GE may be provided on the active pattern AP and may extend in a second direction D2 intersecting the first direction D1. In exemplary embodiments, the gate electrode GE may cover the top surface of the active pattern AP and the top surface of the device isolation layer ST, as illustrated in FIG. 1C. In other exemplary embodiments, the gate electrode GE may cover the top surface and the exposed sidewalls of the active pattern AP and may extend onto the top surface of the device isolation layer ST, as illustrated in FIG. 1D.

In some exemplary embodiments, even though not shown in the drawings, the active pattern AP may be provided in plurality. In such embodiments, one gate electrode GE may intersect the plurality of active patterns AP. Each of the active patterns AP may include the first buffer pattern 102, the doped pattern 104, the second buffer pattern 106, and the channel pattern 108. Each of the active patterns AP may further include the barrier pattern 112. The doped patterns 104 of the plurality of active patterns AP may have the same conductivity type.

A gate insulating pattern GI may be provided between the gate electrode GE and the active pattern AP. The gate insulating pattern GI may extend along a bottom surface of the gate electrode GE in the second direction D2. According to exemplary embodiments, the gate insulating pattern GI may be in contact with the top surface of the active pattern AP and the top surface of the device isolation layer ST, as illustrated in FIG. 1C. Alternatively, the gate insulating pattern GI may be in contact with the top surface and the exposed sidewalls of the active pattern AP and may extend onto the top surface of the device isolation layer ST so as to be in contact with the top surface of the device isolation layer ST, as illustrated in FIG. 1D.

A capping pattern CAP may be provided on a top surface of the gate electrode GE, and gate spacers GS may be provided on both sidewalls of the gate electrode GE.

In exemplary embodiments, the gate insulating pattern GI may include at least one of a high-k dielectric layer (e.g., a hafnium oxide layer, a hafnium silicate layer, a zirconium oxide layer, or a zirconium silicate layer) or a silicon oxide layer, for example. The gate electrode GE may include at least one of doped silicon, a metal, or a conductive metal nitride (e.g., titanium nitride (TiN) or tantalum nitride (TaN)). The capping pattern CAP and the gate spacers GS may include a nitride such as silicon nitride.

Source/drain regions 110 may be provided in the active pattern AP at both sides of the gate electrode GE. The source/drain regions 110 may be laterally spaced apart from each other with the channel pattern 108 interposed therebetween. The channel pattern 108 may be locally disposed under the gate electrode GE, and the source/drain regions 110 may be provided at both sides of the gate electrode GE, respectively. The source/drain regions 110 and the channel pattern 108 may be provided on the second buffer pattern 106. The source/drain regions 110 may include a conductive material. As illustrated in FIG. 1B, the source/drain regions 110 may be provided in the active pattern AP at both sides of the gate electrode GE. However, inventive concepts are not limited thereto.

In exemplary embodiments in which a semiconductor component including the active pattern AP, the gate electrode GE and the source/drain regions 110 is an N-type metal-oxide-semiconductor (NMOS) field effect transistor, the second buffer pattern 106 may provide a tensile strain to the channel pattern 108. In some exemplary embodiments, the second buffer pattern 106 may be formed of $Si_{1-x}Ge_x$, and the channel pattern 108 may be formed of silicon (Si). In other embodiments, the second buffer pattern 106 may be formed of $Si_{1-x}Ge_x$, and the channel pattern 108 may be formed of $Si_{1-y}Ge_y$ (where x>y). In still other exemplary embodiments, the second buffer pattern 106 may be formed of $In_{1-x}Ga_xAs$, and the channel pattern 108 may be formed of $In_{1-y}Ga_yAs$ (where x<y).

Alternatively, in exemplary embodiments in which the semiconductor component is a P-type MOS (PMOS) field effect transistor, the second buffer pattern 106 may provide a compressive strain to the channel pattern 108. In some exemplary embodiments, the second buffer pattern 106 may be formed of $Si_{1-x}Ge_x$, and the channel pattern 108 may be formed of germanium (Ge). In other exemplary embodiments, the second buffer pattern 106 may be formed of $Si_{1-z}Ge_z$, and the channel pattern 108 may be formed of $Si_{1-w}Ge_w$ (where z<w). In still other exemplary embodiments, the second buffer pattern 106 may be formed of $In_{1-z}Ga_zAs$, and the channel pattern 108 may be formed of $In_{1-w}Ga_wAs$ (where z>w).

In exemplary embodiments in which the semiconductor component is the NMOS field effect transistor, the doped pattern 104 may be N-type. In such exemplary embodiments, the doped pattern 104 may provide extra electrons to the channel pattern 108 when the NMOS field effect transistor is turned-on. Alternatively, in exemplary embodiments in which the semiconductor component is the PMOS field effect transistor, the doped pattern 104 may be P-type. In such exemplary embodiments, the doped pattern 104 may provide extra holes to the channel pattern 108 when the PMOS field effect transistor is turned-on. That is, in exemplary embodiments in accordance with principles of inventive concepts the doped pattern 104 may provide the extra carriers (e.g., electrons or holes) to the channel pattern 108, so electrical conductivity of the channel pattern 108 may be increased.

According to inventive concepts, the extra carriers may be provided to the channel pattern 108 using the doped pattern 104 which is formed of graphene injected or doped with the impurity. In this manner, in accordance with principles of inventive concepts, the electrical conductivity in the channel pattern 108 may be increased to improve an operating characteristic of the field effect transistor. In addition, the doped pattern 104 may have a uniform thickness t of the one atomic layer employing the two-dimensional crystal structure of the graphene, so a characteristic dispersion of the field effect transistor may be improved. Furthermore, heat generated from the field effect transistor including the doped pattern 104 may be easily dissipated by a high heat conductivity property of the graphene.

Figure 6:
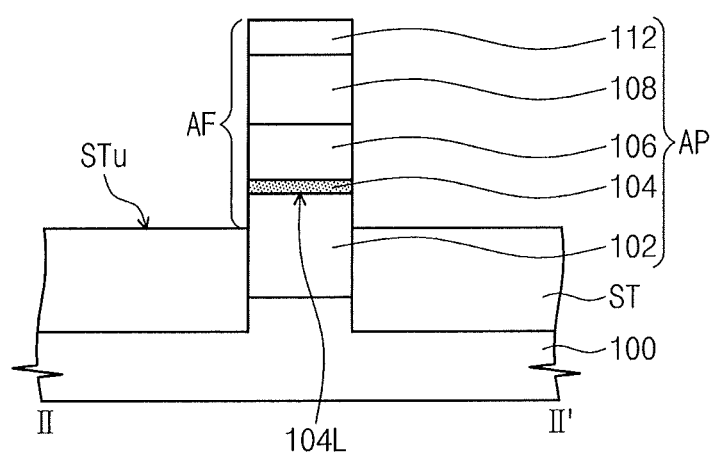
FIG. 6 is a cross-sectional view corresponding to the line II-II' of FIG. 1A to illustrate a method of forming a semiconductor device according to a modified embodiment of a first embodiment of the inventive concepts.
Figure 7A:
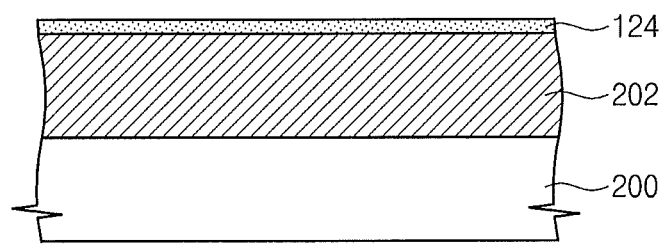
FIGS. 7A, 7B, and 7C are conceptual diagrams illustrating a method of forming a graphene layer on a first buffer layer.
Figure 7B:
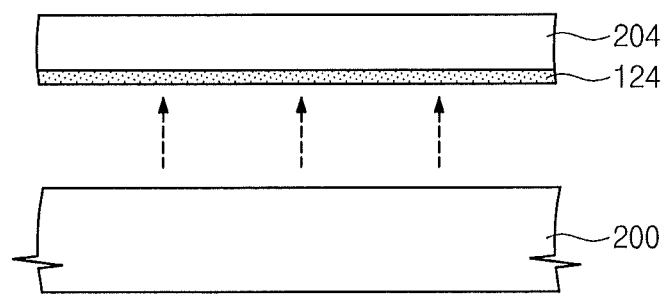
Figure 7C:
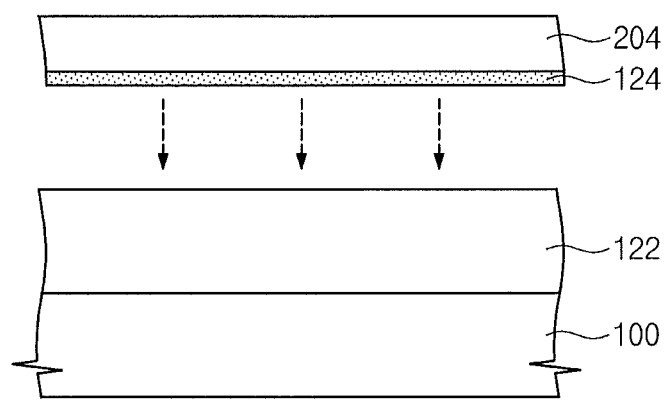
Figure 8A:
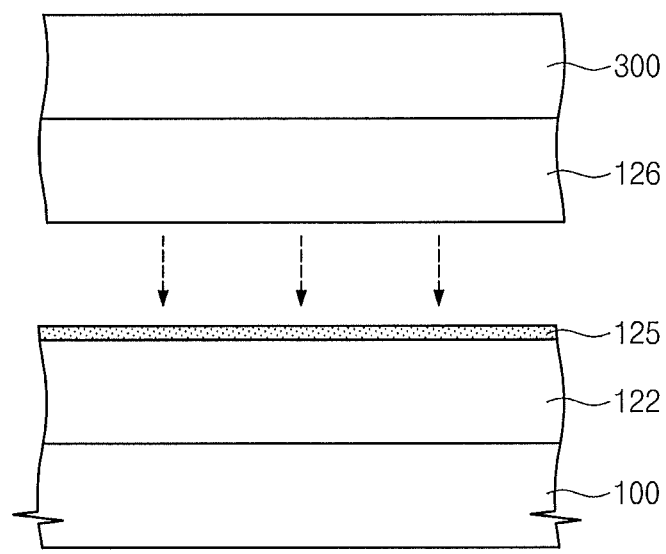
FIGS. 8A, 8B, and 8C are conceptual diagrams illustrating a method of forming a second buffer layer on a doped graphene layer.
Figure 8B:
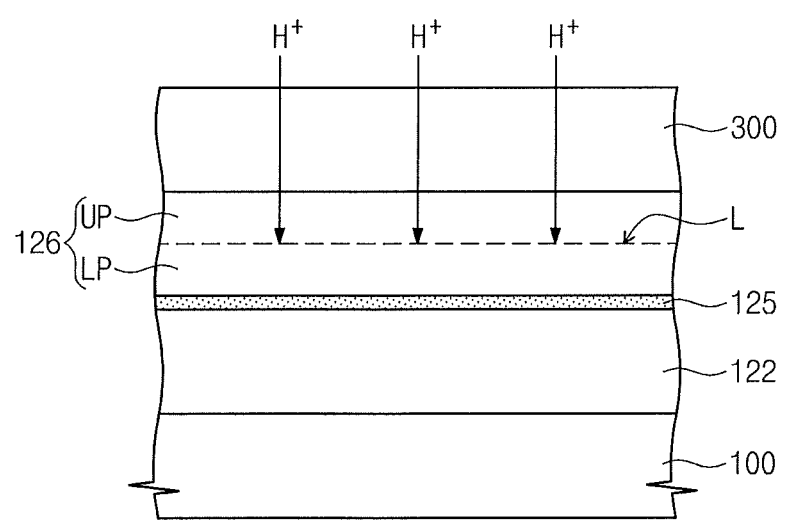
Figure 8C:
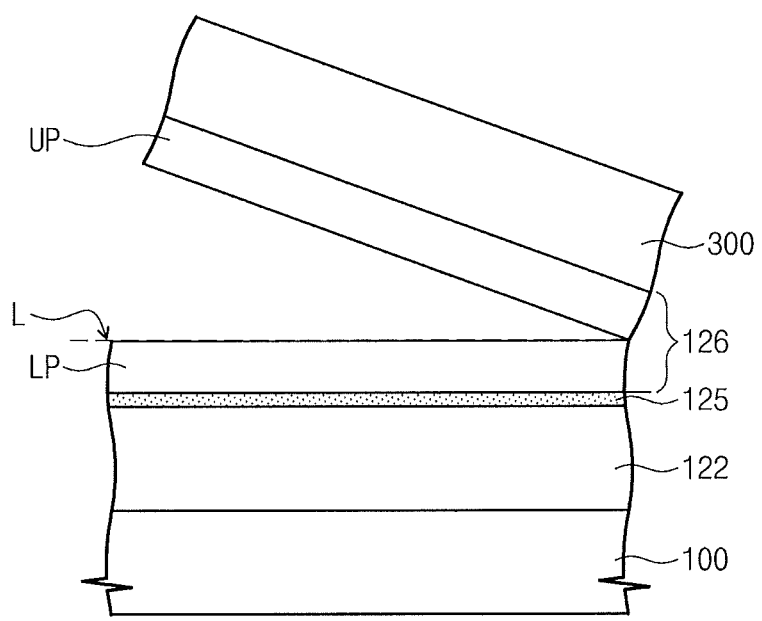

FIGS. 2 to 5 are cross-sectional views corresponding to the lines I-I' and II-II' of FIG. 1A to illustrate a method of forming a semiconductor device according to a first exemplary embodiment in accordance with principles of inventive concepts. FIG. 6 is a cross-sectional view corresponding to the line II-II' of FIG. 1A to illustrate a method of forming a semiconductor device according to a modified embodiment of a first embodiment of the inventive concepts. FIGS. 7A, 7B, and 7C are conceptual diagrams illustrating a method of forming a graphene layer on a first buffer layer. FIGS. 8A, 8B, and 8C are conceptual diagrams illustrating a method of forming a second buffer layer on a doped graphene layer.

Referring to FIG. 2, a first buffer layer 122 may be formed on a substrate 100. The first buffer layer 122 may include silicon (Si), germanium (Ge), silicon-germanium (SiGe), or a III-V group compound, for example. In some exemplary embodiments, the first buffer layer 122 may be formed by a selective epitaxial growth (SEG) process using the substrate 100 as a seed. In other exemplary embodiments, the first buffer layer 122 may be formed by a chemical vapor deposition (CVD) process or a molecular beam epitaxy process. A graphene layer 124 may be provided on the first buffer layer 122. The graphene layer 124 may be formed on an additional support substrate and then may be provided on the first buffer layer 122 by a transfer process. Hereinafter, an example of the method of providing the graphene layer 124 onto the first buffer layer 122 in accordance with principles of inventive concepts will be described in detail with reference to FIGS. 7A, 7B, and 7C.

Referring to FIG. 7A, a first support substrate 200 may be first provided. The first support substrate 200 may include, for example, silicon oxide. A metal catalyst layer 202 may be deposited on the first support substrate 200. The metal catalyst layer 202 may be formed by, for example, a CVD process. The metal catalyst layer 202 may include a transition metal such as nickel (Ni), copper (Cu), and/or platinum (Pt), for example. The graphene layer 124 may be formed on the metal catalyst layer 202 by a CVD process. In an exemplary embodiment, a mixture gas of methane and hydrogen may be provided on the metal catalyst layer 202 at a high temperature of 1000° C., so carbon included in the mixture gas may be adsorbed to the metal catalyst layer 202. Thereafter, carbon atoms included in the metal catalyst layer 202 may be crystallized on a surface of the metal catalyst layer 202 by a cooling process, so the graphene layer 124 may be formed. In exemplary embodiments in accordance with principles of inventive concepts graphene layer 124 may be provided onto the first buffer layer 122 by a transfer process that will be described later.

Referring to FIG. 7B, an adhesive member 204 may be adhered to one surface of the graphene layer 124. The adhesive member 204 may be, for example, a thermal release tape. Next, a wet etching process may be performed to remove the metal catalyst layer 202. In this manner, in accordance with principles of inventive concepts, graphene layer 124 and the adhesive member 204 adhered thereto may be separated from the first support substrate 200.

Referring to FIGS. 2 and 7C, the graphene layer 124 adhered to the adhesive member 204 may be provided onto, or transferred to, the first buffer layer 122. The graphene layer 124 may be provided onto the first buffer layer 122 such that another surface (that is, the surface not in contact with adhesive member 204) of the graphene layer 124 may be in contact with a top surface of the first buffer layer 122. Subsequently, the adhesive member 204 may be separated from the graphene layer 124 by a thermal treatment process, so the graphene layer 124 may be transferred to the top surface of the first buffer layer 122.

Referring to FIG. 3, the graphene 124 may be doped with an impurity IM to form a doped graphene layer 125. If the doped graphene layer 125 has an N-type, the impurity IM may include, for example, halogen atoms (e.g., nitrogen or fluorine). If the doped graphene layer 125 has a P-type, the impurity IM may include, for example, boron. A concentration of the impurity IM in the doped graphene layer 125 may be higher than $1 \times 10^6 / cm^2$ and equal to or lower than $1 \times 10^{12} / cm^2$. Doping the graphene layer 124 with the impurity IM may include exposing the graphene layer 124 to an arc discharge. In such exemplary embodiments, the impurity IM may be substituted for one or some of the carbon atoms of the graphene layer 124 to form the doped graphene layer 125.

Figure 4:
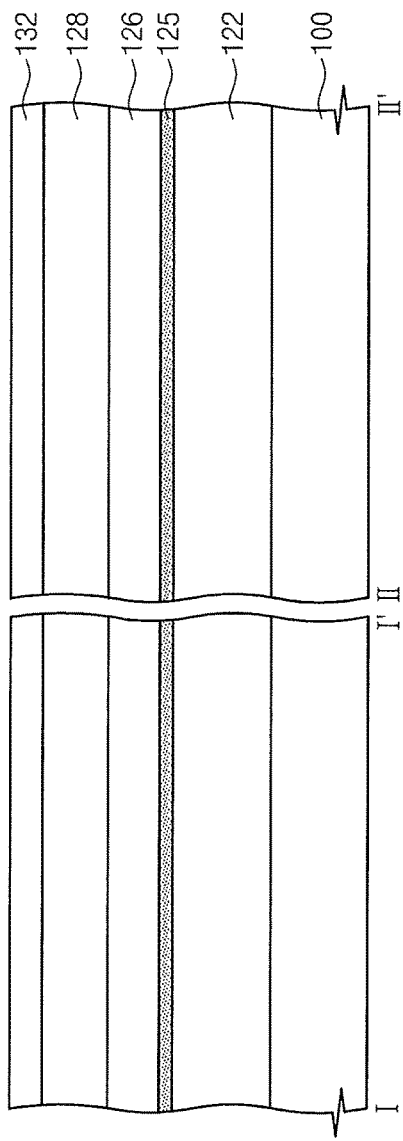

Referring to FIG. 4, a second buffer layer 126, a channel layer 128, and a barrier layer 132 may be sequentially formed on the doped graphene layer 125. A method in accordance with principles of inventive concepts of forming the second buffer layer 126 on the doped graphene layer 125 will be described in detail with reference to FIGS. 8A, 8B, and 8C.

Referring to FIG. 8A, a second buffer layer 126 may be formed on a second support substrate 300. The second support substrate 300 may be a semiconductor substrate formed of silicon, germanium, or silicon-germanium or may be a SOI substrate, for example. The second buffer layer 126 may include the same material as the first buffer layer 122 and may include silicon (Si), germanium (Ge), silicon-germanium (SiGe), or a III-V group compound, for example. According to an exemplary embodiment, the second buffer layer 126 may include the same material as the first buffer layer 122 and may have the same composition ratio as the first buffer layer 122. Alternatively, the second buffer layer 126 may include the same material as the first buffer layer 122, but the composition ratio of the second buffer layer 126 may be different from that of the first buffer layer 122. In an exemplary embodiment, the second buffer layer 126 may be formed by a SEG process using the second support substrate 300 as a seed. In another exemplary embodiment, the second buffer layer 126 may be formed using a CVD process or a molecular beam epitaxy process.

The second buffer layer 126 formed on the second support substrate 300 may be provided on the doped graphene layer 125. The second buffer layer 126 may have a first surface being in contact with the second support substrate 300 and a second surface opposite to the first surface. The second surface of the second buffer layer 126 may face a top surface of the doped graphene layer 125.

Referring to FIG. 8B, the second buffer layer 126 and the second support substrate 300 may be provided on the doped graphene layer 125 such that the second surface of the second buffer layer 126 may be in contact with the top surface of the doped graphene layer 125. In exemplary embodiments, the second buffer layer 126 may be adhered to the doped graphene layer 125 by pressure or heat. Hereinafter, a method of removing the second support substrate 300 from the second buffer layer 126 will be described.

An ion implantation process may be performed on the substrate 100 to implant hydrogen ions $H^+$ into the second buffer layer 126. In this manner, in accordance with principles of inventive concepts a bubble layer may be formed in the second buffer layer 126 to define an interface L at which the second buffer layer 126 can be physically divided.

Second buffer layer 126 may be divided into an upper portion UP adjacent to the second support substrate 300 and a lower portion LP adjacent to the doped graphene layer 125 by interface L.

Referring to FIG. 8C, the second support substrate 300 and the upper portion UP of the second buffer layer 126 may be physically separated and removed from the lower portion LP of the second buffer layer 126 along interface L. Next, though not shown in the drawings, a planarization process (e.g., a polishing process or an etch-back process) may be performed on the lower portion LP of the second buffer layer 126. In this manner, in accordance with principles of inventive concepts, the lower portion LP of the second buffer layer 126 remaining on the doped graphene layer 125 may have a flat top surface and a predetermined thickness in a direction perpendicular to a top surface of the substrate 100. Hereinafter, the remaining lower portion LP of the second buffer layer 126 may be referred to as a second buffer layer 126.

Referring again to FIG. 4, the channel layer 128 and the barrier layer 132 may be sequentially formed on the second buffer layer 126.

The channel layer 128 may include a material of which an energy band gap is smaller than that of the second buffer layer 126. In some exemplary embodiments, the channel layer 128 may include a material of which an energy band gap is smaller than those of the first and second buffer layers 122 and 126. The channel layer 128 may include silicon (Si), germanium (Ge), silicon-germanium (SiGe), or a III-V group compound, for example. The channel layer 128 may receive a compressive strain or a tensile strain from the second buffer layer 126. In some exemplary embodiments, the channel layer 128 may be formed using a SEG process, a CVD process, or a molecular beam epitaxy process.

The barrier layer 132 may include a material of which an energy band gap is greater than that of the channel layer 128. That is, in exemplary embodiments in accordance with principles of inventive concepts, the channel layer 128 may include the material of which the energy band gap is smaller than those of the barrier layer 132 and the second buffer layer 126. As a result, in accordance with principles of inventive concepts, the channel layer 128 may have a quantum well structure. The barrier layer 132 may include silicon (Si), germanium (Ge), silicon-germanium (SiGe), or a III-V group compound. In other exemplary embodiments, the barrier layer 132 may be omitted.

Figure 5:
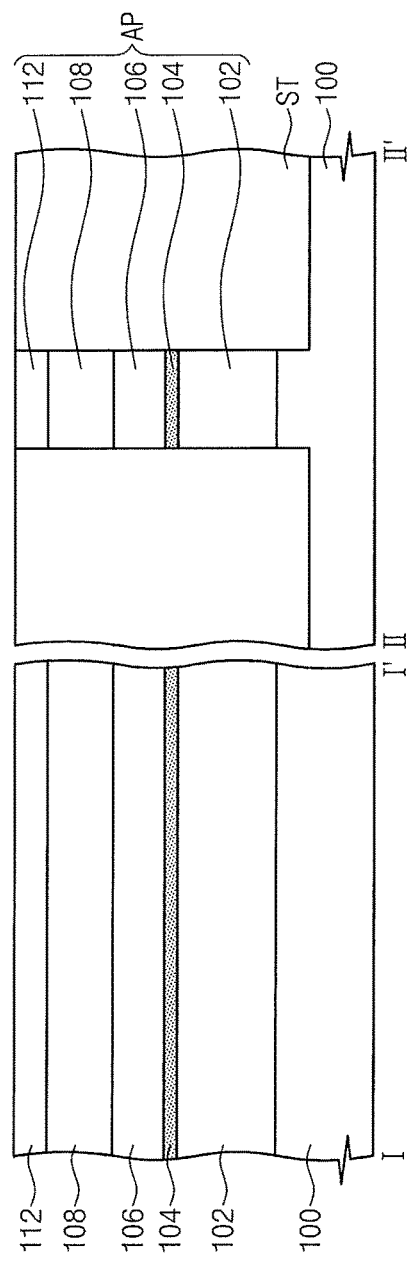

Referring to FIG. 5, the barrier layer 132, the channel layer 128, the second buffer layer 126, the doped graphene layer 125, and the first buffer layer 122 may be sequentially patterned to form an active pattern AP on the substrate 100. An upper portion of the substrate 100 may be recessed during the patterning process. In exemplary embodiments on accordance with principles of inventive concepts, active pattern AP may include a first buffer pattern 102, a doped pattern 104, a second buffer pattern 106, a channel pattern 108, and a barrier pattern 112 which are sequentially stacked on the substrate 100.

A device isolation layer ST covering sidewalls of the active pattern AP may be formed on the substrate 100. Forming the device isolation layer ST may include forming an insulating layer covering the active pattern AP on the substrate 100, and planarizing the insulating layer until a top surface of the active pattern AP is exposed. The insulating layer may include at least one of an oxide layer, a nitride layer, or an oxynitride layer, for example. In some exemplary embodiments, the sidewalls of the active pattern AP may not be exposed by the device isolation layer ST, as illustrated in FIG. 5. In other embodiments, the active pattern AP may include an upper portion (hereinafter, referred to as 'an active fin AF') exposed by the device isolation layer ST, as illustrated in FIG. 6. That is, in accordance with principles of inventive concepts, upper portions of both sidewalls of the active pattern AP may be exposed by the device isolation layer ST. In this case, the planarization process may be performed until the device isolation layer ST has a desired thickness on the substrate 100. As a result, in exemplary embodiments in accordance with principles of inventive concepts, a height of a top surface STu of the device isolation layer ST may be lower than a height of a bottom surface 104L of the doped pattern 104.

Referring again to FIGS. 1A, 1B, and 1C, a gate electrode GE intersecting the active pattern AP may be formed on the substrate 100. In an exemplary embodiment, the gate electrode GE may cover the top surface of the active pattern AP and a top surface of the device isolation layer ST, as illustrated in FIG. 1C. In another exemplary embodiment, the gate electrode GE may cover the top surface and the exposed sidewalls of the active pattern AP and may extend onto the top surface of the device isolation layer ST, as illustrated in FIG. 1D.

A gate insulating pattern GI may be formed between the gate electrode GE and the active pattern AP, and a capping pattern CAP may be formed on a top surface of the gate electrode GE. According to an exemplary embodiment, forming the gate insulating pattern GI, the gate electrode GE, and the capping pattern CAP may include sequentially forming a gate insulating layer, a gate electrode layer, and a capping layer on the substrate 100, and successively patterning the capping layer, the gate electrode layer, and the gate insulating layer to form the capping pattern CAP, the gate electrode GE, and the gate insulating pattern GI. The gate insulating pattern GI may include at least one of a high-k dielectric layer (e.g., a hafnium oxide layer, a hafnium silicate layer, a zirconium oxide layer, or a zirconium silicate layer) or a silicon oxide layer, for example. The gate electrode GE may include at least one of doped silicon, a metal, or a conductive metal nitride (e.g., titanium nitride (TiN) or tantalum nitride (TaN)). The capping pattern CAP may include, for example, a nitride layer such as a silicon nitride layer.

Subsequently, gate spacers GS may be formed on both sidewalls of the gate electrode GE. In some exemplary embodiments, a spacer layer may be formed on the substrate 100 having the gate insulating pattern GI, the gate electrode GE, and the capping pattern CAP, and the spacer layer may be anisotropically etched to form the gate spacers GS. The gate spacers GS may include a nitride layer such as a silicon nitride layer, for example. Thereafter, source/drain regions 110 may be formed in the active pattern AP at both sides of the gate electrode GE.

Figure 9A:
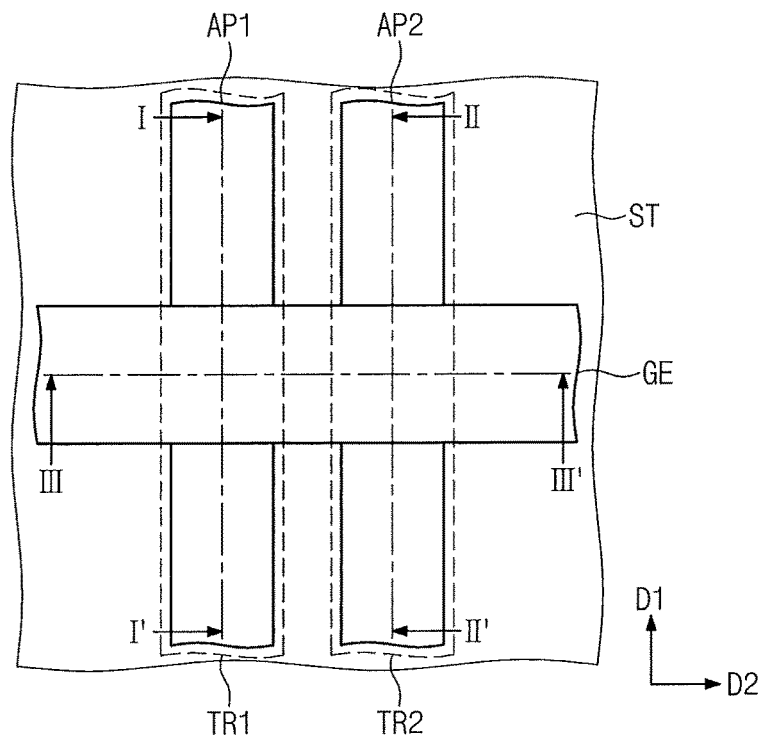
FIG. 9A is a plan view illustrating a semiconductor device according to a second embodiment of the inventive concepts.
Figure 9B:
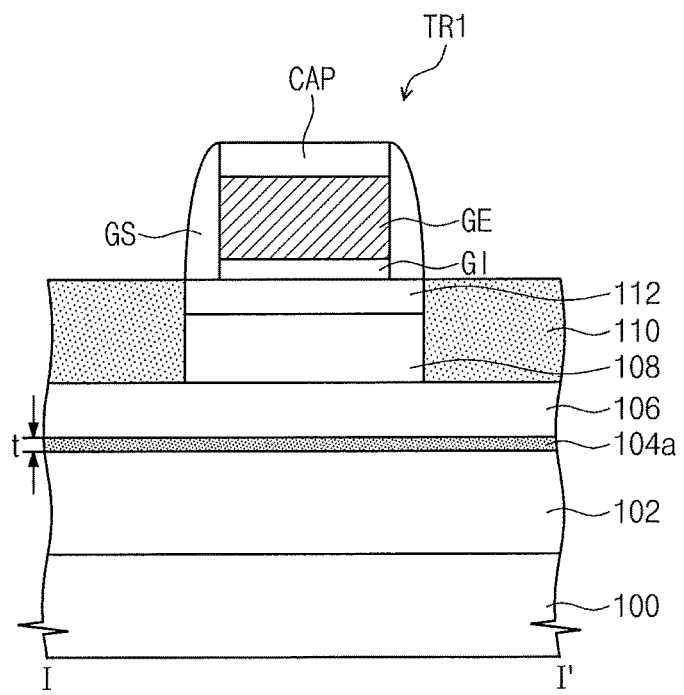
FIGS. 9B, 9C, and 9D are cross-sectional views taken along lines I-I', II-II', and III-III' of FIG. 9A, respectively.
Figure 9C:
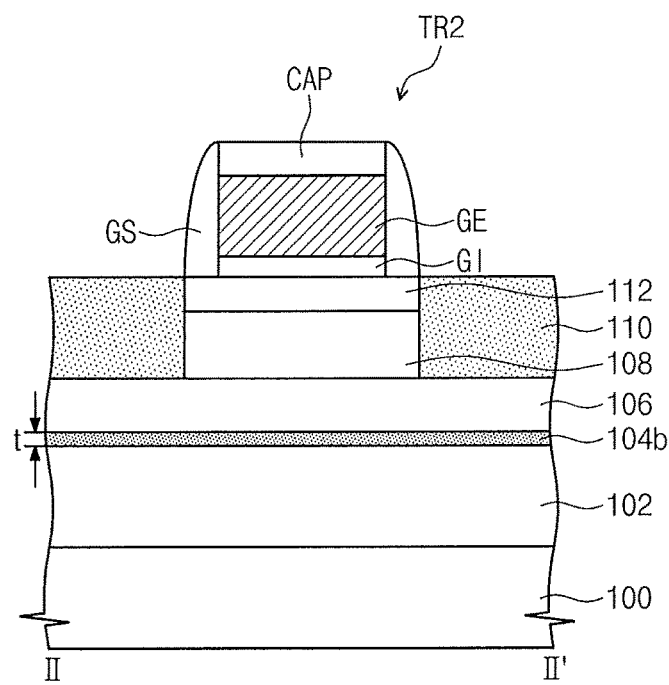
Figure 9D:
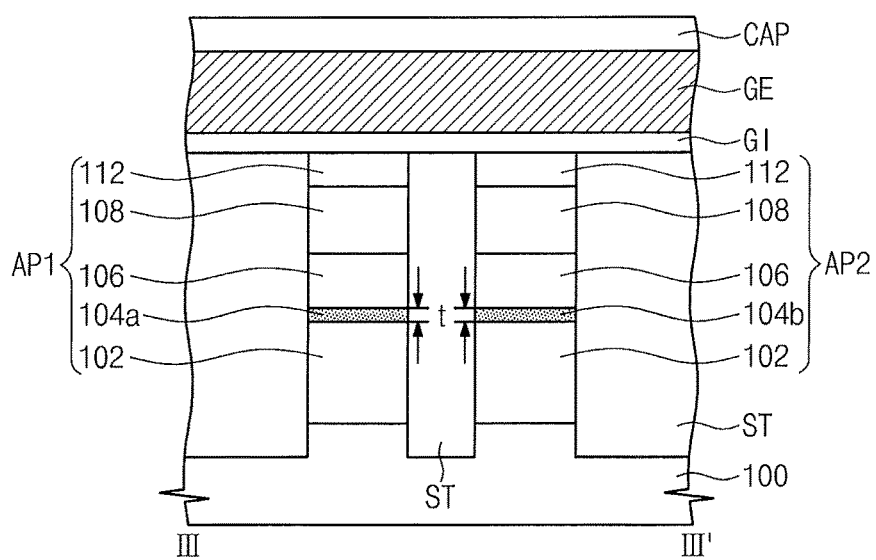
Figure 9E:
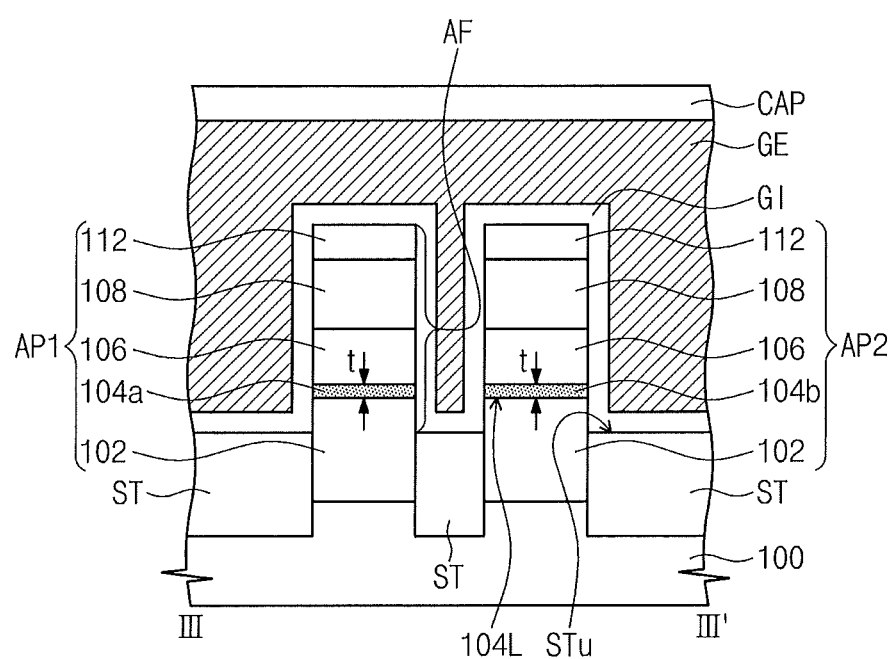
FIG. 9E is a cross-sectional view corresponding to the line III-III' of FIG. 9A to illustrate a semiconductor device according to a modified embodiment of a second embodiment of the inventive concepts.

FIG. 9A is a plan view illustrating a semiconductor device according to a second exemplary embodiment in accordance with principles of inventive concepts. FIGS. 9B, 9C, and 9D are cross-sectional views taken along lines I-I', II-II', and III-III' of FIG. 9A, respectively. FIG. 9E is a cross-sectional view corresponding to the line III-III' of FIG. 9A to illustrate a semiconductor device according to a modified embodiment of a second embodiment of the inventive concepts. In the present exemplary embodiment, the same elements as described in the first embodiment of FIGS. 1A to 1C will be indicated by the same reference numerals or the same reference designators. For the purpose of ease and convenience in explanation, the descriptions to the same elements as in the first embodiment will be omitted or mentioned only briefly here.

Referring to FIGS. 9A, 9B, 9C, and 9D, a device isolation layer ST defining a plurality of active patterns AP1 and AP2 may be provided on a substrate 100. The active patterns AP1 and AP2 may include a first active pattern AP1 and a second active pattern AP2 that are spaced apart from each other with the device isolation layer ST interposed therebetween. Each of the active patterns AP1 and AP2 may have a bar shape extending in a first direction D1. The active patterns AP1 and AP2 may be spaced apart from each other in a second direction D2 intersecting the first direction D1.

Each of the active patterns AP1 and AP2 may include a first buffer pattern 102 on the substrate 100, a channel pattern 108 on the first buffer pattern 102, and a second buffer pattern 106 between the first buffer pattern 102 and the channel pattern 108. In an exemplary embodiment, each of the active patterns AP1 and AP2 may further include a barrier pattern 112 disposed on the channel pattern 108. In such exemplary embodiments, the channel pattern 108 may be disposed between the barrier pattern 112 and the second buffer pattern 106.

According to the present exemplary embodiment, the first active pattern AP1 may include a first doped pattern 104a disposed between the first and second buffer patterns 102 and 106 of the first active pattern AP1, and the second active pattern AP2 may include a second doped pattern 104b disposed between the first and second buffer patterns 102 and 106 of the second active pattern AP2.

Each of the first and second doped patterns 104a and 104b may include graphene that is injected or doped with an impurity and may have a crystal structure formed by substituting the impurity for one or some of carbon atoms of the graphene. Each of the first and second doped patterns 104a and 104b may have a thickness t of one atomic layer employing a two-dimensional crystal structure of the graphene. The thickness t of the first doped pattern 104a may be substantially equal to the thickness t of the second doped pattern 104b.

The first doped pattern 104a and the second doped pattern 104b may have different conductivity types from each other. For example, if the first doped pattern 104a has a P-type, the second doped pattern 104b has an N-type. If the first doped pattern 104a has the P-type, the impurity of the first doped pattern 104a may be, for example, boron. If the second doped pattern 104b has the N-type, the impurity of the second doped pattern 104b may be, for example, halogen atoms such as nitrogen or fluorine.

In a cross-sectional view, the first doped pattern 104a may be more adjacent, or closer, to the channel pattern 108 of the first active pattern AP1 than to the substrate 100. The first doped pattern 104a may provide extra carriers to the channel pattern 108 of the first active pattern AP1. If the first doped pattern 104a has the P-type, the first doped pattern 104a may provide extra holes to the channel pattern 108 of the first active pattern AP1, for example. Similarly, the second doped pattern 104b may be more adjacent, or closer, to the channel pattern 108 of the second active pattern AP2 than to the substrate 100. The second doped pattern 104b may provide extra carriers to the channel pattern 108 of the second active pattern AP2. If the second doped pattern 104b has the N-type, the second doped pattern 104b may provide extra electrons to the channel pattern 108 of the second active pattern AP2, for example.

According to the present exemplary embodiment, the channel pattern 108 of the first active pattern AP1 may be formed of the same material as the channel pattern 108 of the second active pattern AP2. In some exemplary embodiments, the channel patterns 108 of the first and second active patterns AP1 and AP2 may include a III-group antimonide (Sb) compound. The III-group antimonide may include indium-gallium antimonide (InGaSb) or indium antimonide (InSb), for example.

The first buffer pattern 102 of the first active pattern AP1 may be formed of the same material as the first buffer pattern 102 of the second active pattern AP2. The second buffer pattern 106 of the first active pattern AP1 may be formed of the same material as the second buffer pattern 106 of the second active pattern AP2. The barrier pattern 112 of the first active pattern AP1 may be formed of the same material as the barrier pattern 112 of the second active pattern AP2.

In each of the active patterns AP1 and AP2, the channel pattern 108 may include a material of which an energy band gap is smaller than those of the second buffer pattern 106 and the barrier pattern 112. As a result, in accordance with principles of inventive concepts, the channel pattern 108 may have a quantum well structure. In other exemplary embodiments, the barrier pattern 112 may be omitted in each of the active patterns AP1 and AP2.

According to an exemplary embodiment, both sidewalls of each of the active patterns AP1 and AP2 may not be exposed by the device isolation layer ST, as illustrated in FIG. 9D. Alternatively, each of the active patterns AP1 and AP2 may have an upper portion (e.g., an active fin AF) exposed by the device isolation layer ST, as illustrated in FIG. 9E. That is, in accordance with principles of inventive concepts, upper portions of the both sidewalls of each of the active patterns AP1 and AP2 may be exposed by the device isolation layer ST. In such embodiments, a height of a top surface STu of the device isolation layer ST may be lower than a height of a bottom surface 104L of each of the first and second doped patterns 104a and 104b.

A gate electrode GE may be provided to intersect the active patterns AP1 and AP2. According to an exemplary embodiment, one gate electrode GE may intersect the plurality of active patterns AP1 and AP2, as illustrated in FIG. 9A. Alternatively, unlike FIG. 9A, a plurality of gate electrodes GE may be provided to intersect the plurality of active patterns AP1 and AP2, respectively.

The gate electrode GE may be provided on the active patterns AP1 and AP2 and may extend in the second direction D2. According to an exemplary embodiment, the gate electrode GE may cover top surfaces of the active patterns AP1 and AP2 and a top surface of the device isolation layer ST, as illustrated in FIG. 9D. According to another exemplary embodiment, the gate electrode GE may cover the top surfaces and the exposed sidewalls of the active patterns AP1 and AP2 and may extend onto the top surface of the device isolation layer ST, as illustrated in FIG. 9E. A gate insulating pattern GI may be provided between the gate electrode GE and the active patterns AP1 and AP2. The gate insulating pattern GI may extend along a bottom surface of the gate electrode GE in the second direction D2. A capping pattern CAP may be provided on a top surface of the gate electrode GE, and gate spacers GS may be provided on both sidewalls of the gate electrode GE. Source/drain regions 110 may be provided in the active patterns AP1 and AP2 at both sides of the gate electrode GE. As a result, in accordance with principles of inventive concepts, a first transistor TR1 and a second transistor TR2 may be provided on the substrate 100. The first transistor TR1 may include the first active pattern AP1, and the second transistor TR2 may include the second active pattern AP2.

The first transistor TR1 and the second transistor TR2 may be field effect transistors that have different conductivity types from each other. In some exemplary embodiments, the first transistor TR1 may be a PMOS field effect transistor, and the second transistor TR2 may be an NMOS field effect transistor. According to the present exemplary embodiment, the channel pattern 108 of the first transistor TR1 may be formed of the same material as the channel pattern 108 of the second transistor TR2. The conductivity types of the first and second transistors TR1 and TR2 may be determined depending on the conductivity types of the first and second doped patterns 104a and 104b. That is, in exemplary embodiments in accordance with principles of inventive concepts, if the first doped pattern 104a has the P-type, the first transistor TR1 may be the PMOS field effect transistor and if the second doped pattern 104b has the N-type, the second transistor TR2 may be the NMOS field effect transistor. In such exemplary embodiments, the first doped pattern 104a may provide the extra holes to the channel pattern 108 of the first transistor TR1, and the second doped pattern 104b may provide the extra electrons to the channel pattern 108 of the second transistor TR2.

According to the present exemplary embodiment, the first and second transistors TR1 and TR2, which have the same channel material but have different conductivity types, may be realized using the first and second doped patterns 104a and 104b, which have different conductivity types from each other.

FIGS. 10A to 13A are plan views illustrating an exemplary method of forming a semiconductor device according to a second embodiment of the inventive concepts in accordance with principles of inventive concepts. FIGS. 10B to 13B are cross-sectional views taken along lines I-I', II-II', and III-III' of FIGS. 10A to 13A, respectively. FIG. 14 is a cross-sectional view corresponding to the line III-III' of FIG. 13A to illustrate a method of forming a semiconductor device according to a modified embodiment of a second exemplary embodiment in accordance with principles of inventive concepts. In the present exemplary embodiment, the same elements as described in the formation method according to the first embodiment of FIGS. 2 to 5 will be indicated by the same reference numerals or the same reference designators. For the purpose of ease and convenience in explanation, the descriptions to the same elements as in the formation method of the first embodiment will be omitted or only briefly described.

A first buffer layer 122 may be first formed on a substrate 100, as described with reference to FIG. 2. The first buffer layer 122 may include silicon (Si), germanium (Ge), silicon-germanium (SiGe), or a III-V group compound. A graphene layer 124 may be provided on the first buffer layer 122. As described with reference to FIGS. 7A, 7B, and 7C, the graphene layer 124 may be formed on the first support substrate 200 and may be then provided onto, or formed on, the first buffer layer 122 by means of a transfer process.

Figure 10A:
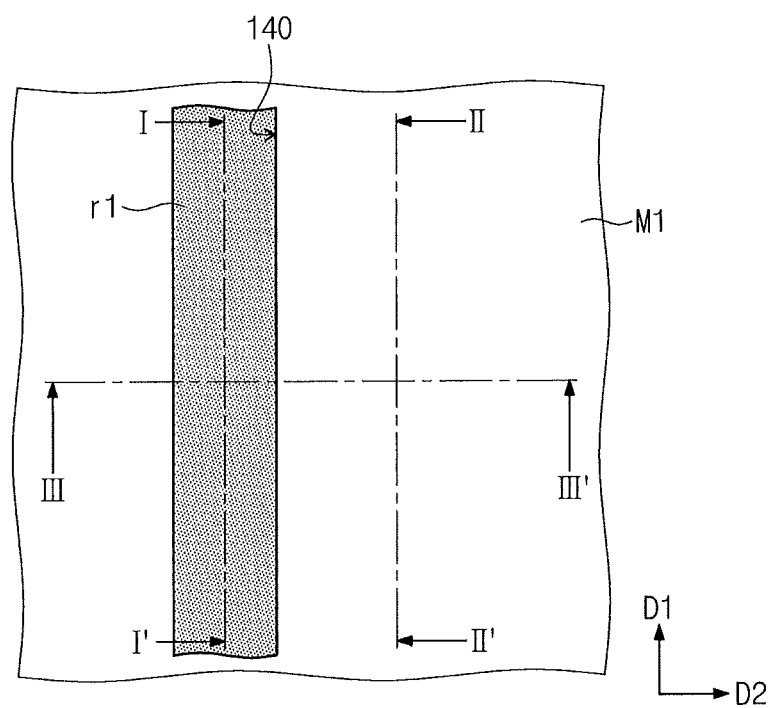

Referring to FIGS. 10A and 10B, a first mask layer M1 may be formed on the graphene layer 124. The first mask layer M1 may be, for example, a photoresist layer. The first mask layer M1 may have a first opening 140 that exposes the graphene layer 124. The first opening 140 may extend in a first direction D1 and may expose a portion of a top surface of the graphene layer 124. The portion of the graphene layer 124 exposed by the first opening 140 may be doped with an impurity IM using the first mask layer M1 as a doping mask. In this manner, a first doped region r1 may be formed in the graphene layer 124. If the first doped region r1 has an N-type, the impurity IM may include, for example, halogen atoms such as nitrogen or fluorine. If the first doped region r1 has a P-type, the impurity IM may include, for example, boron. In some exemplary embodiments, doping the exposed portion of the graphene layer 124 with the impurity IM may include exposing the exposed portion of the graphene layer 124 to an arc discharge in a gas atmosphere including the impurity IM. In such exemplary embodiments, some of carbon atoms of the exposed portion of the graphene layer 124 may be replaced with the impurity IM to form the first doped region r1.

Figure 11A:
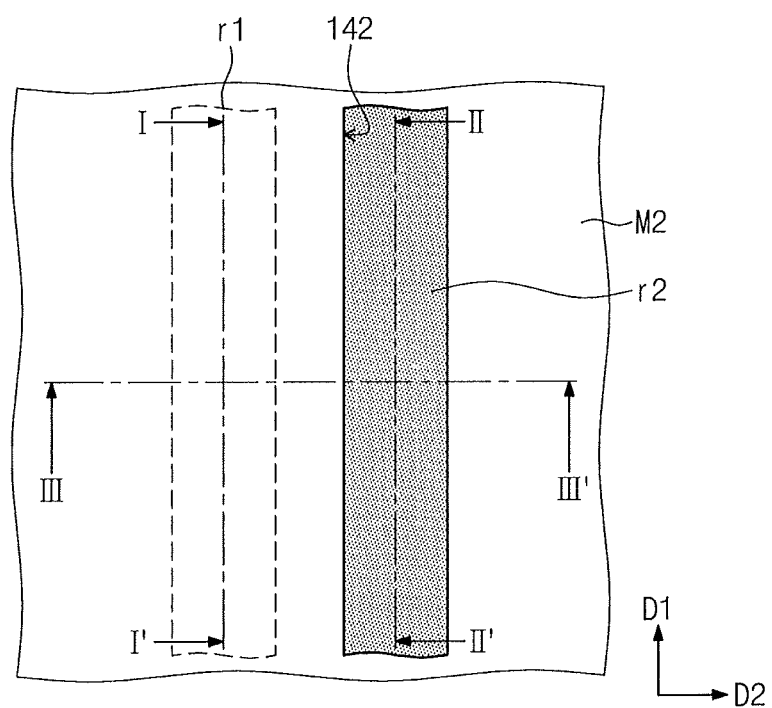

Referring to FIGS. 11A and 11B, the first mask layer M1 may be removed after the formation of the first doped region r1. The first mask layer M1 may be removed by, for example, an ashing process and/or a strip process. Next, a second mask layer M2, which may be a photoresist layer, may be formed on the graphene layer 124 including the first doped region r1. The second mask layer M2 may have a second opening 142 that expose the graphene 124. The second opening 142 may extend in the first direction D1 and may expose a portion of the top surface of the graphene layer 124. The second opening 142 may be spaced apart from the first doped region r1 in a second direction D2 intersecting the first direction D1 when viewed from a plan view.

The portion of the graphene layer 124 exposed by the second opening 142 may be doped with an impurity IM using the second mask layer M2 as a doping mask. In this manner, in accordance with principles of inventive concepts, a second doped region r2 may be formed in the graphene layer 124. The second doped region r2 may be spaced apart from the first doped region r1 in the second direction D2. If the second doped region r2 has an N-type, the impurity IM may include, for example, halogen atoms such as nitrogen or fluorine. If the second doped region r2 has an P-type, the impurity IM may include, for example, boron. The conductivity type of the second doped region r2 may be different from that of the first doped region r1. That is, in accordance with principles of inventive concepts, if the first doped region r1 has the P-type, the second doped region r2 may be N-type. Doping the portion, exposed by the second opening 142, of the graphene layer 124 with the impurity IM may be as described with reference to FIGS. 10A and 10B.

Figure 12A:
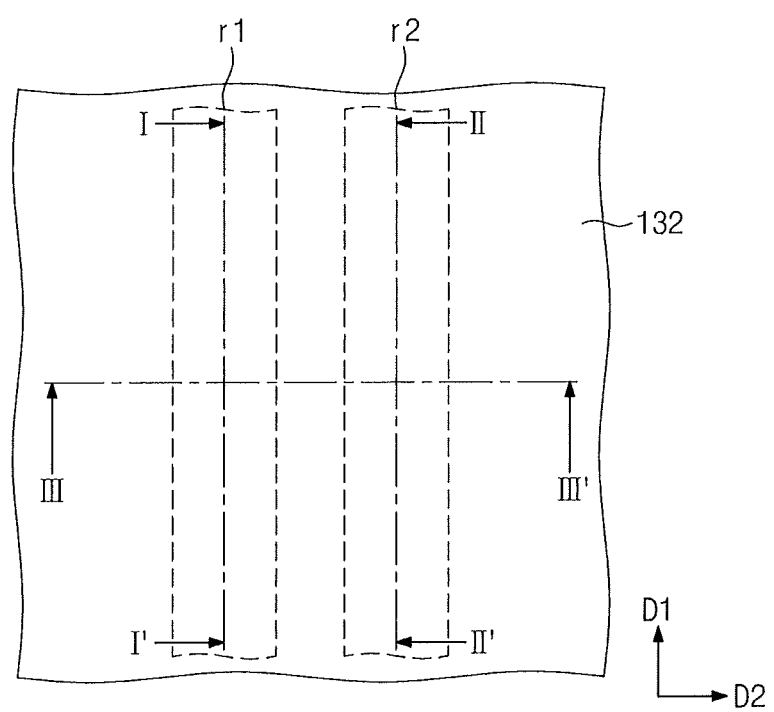
Figure 12B:
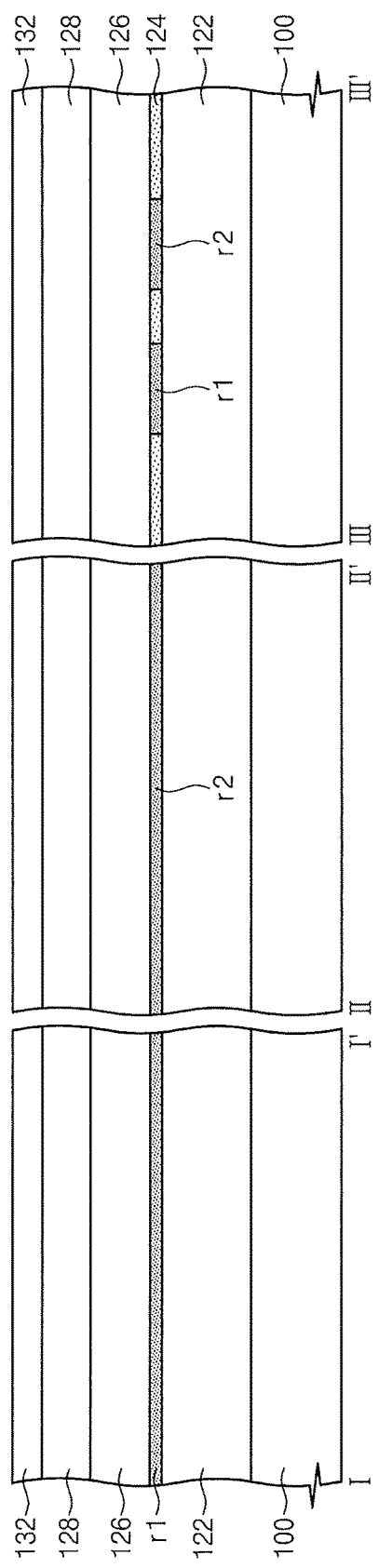

Referring to FIGS. 12A and 12B, the second mask layer M2 may be removed after the formation of the second doped region r2. For example, the second mask layer M2 may be removed by an ashing process and/or a strip process. A second buffer layer 126, a channel layer 128, and a barrier layer 132 may be sequentially formed on the graphene layer 124 including the first and second doped regions r1 and r2.

The second buffer layer 126 may include the same material as the first buffer layer 122 and may include silicon (Si), germanium (Ge), silicon-germanium (SiGe), or a III-V group compound, for example. According to an exemplary embodiment, the second buffer layer 126 may include the same material as the first buffer layer 122 and may have the same composition ratio as the first buffer layer 122. Alternatively, the second buffer layer 126 may include the same material as the first buffer layer 122, but the composition ratio of the second buffer layer 126 may be different from that of the first buffer layer 122. The second buffer layer 126 may be formed as described with reference to FIGS. 8A, 8B, and 8C.

The channel layer 128 may include a material of which an energy band gap is smaller than that of the second buffer layer 126. In some embodiments, the channel layer 128 may include a material of which an energy band gap is smaller than those of the first and second buffer layers 122 and 126.

The channel layer 128 may include silicon (Si), germanium (Ge), silicon-germanium (SiGe), or a III-V group compound.

The barrier layer 132 may include a material of which an energy band gap is greater than that of the channel layer 128. That is, in exemplary embodiments in accordance with principles of inventive concepts, the channel layer 128 may include the material of which the energy band gap is smaller than those of the barrier layer 132 and the second buffer layer 126 and, as a result, the channel layer 128 may have a quantum well structure. The barrier layer 132 may include silicon (Si), germanium (Ge), silicon-germanium (SiGe), or a III-V group compound. In other exemplary embodiments, the barrier layer 132 may be omitted.

The channel layer 128 and the barrier layer 132 may be formed as described with reference to FIG. 4.

Figure 13A:
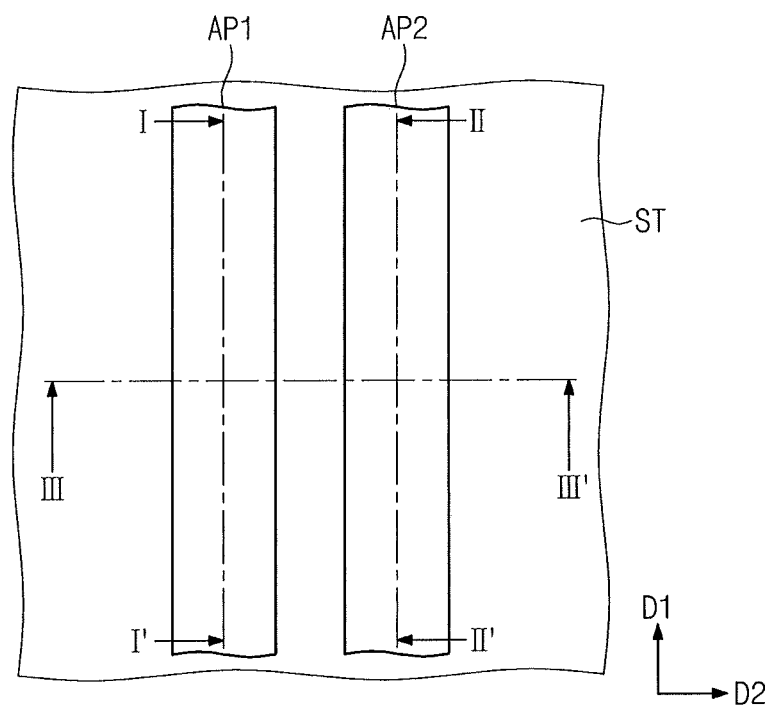
Figure 13B:
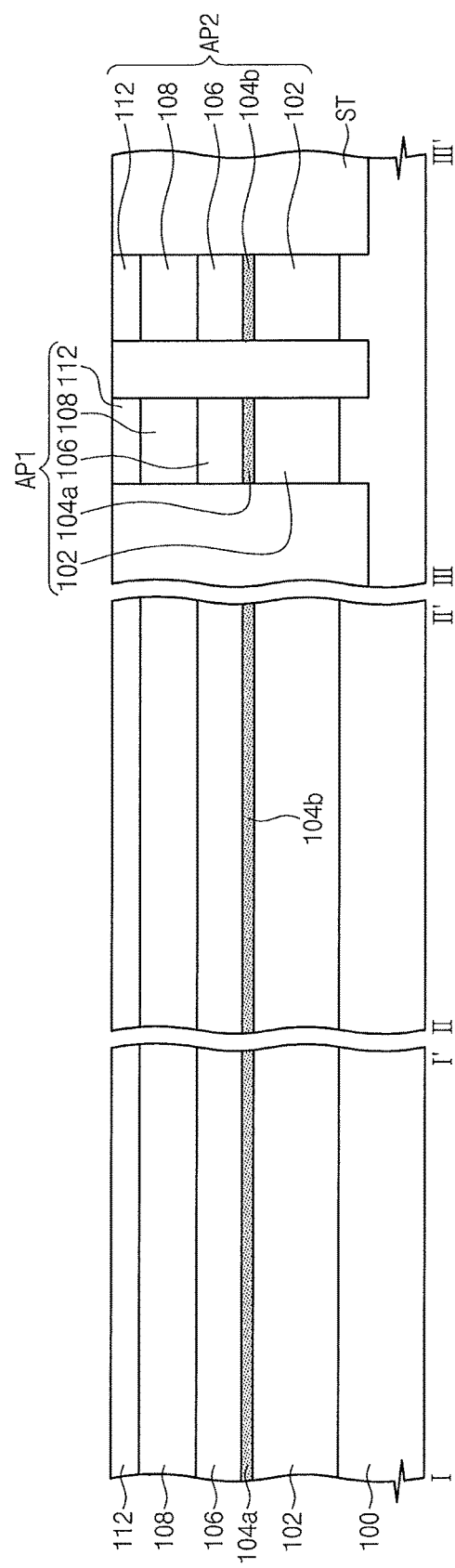
Figure 14:
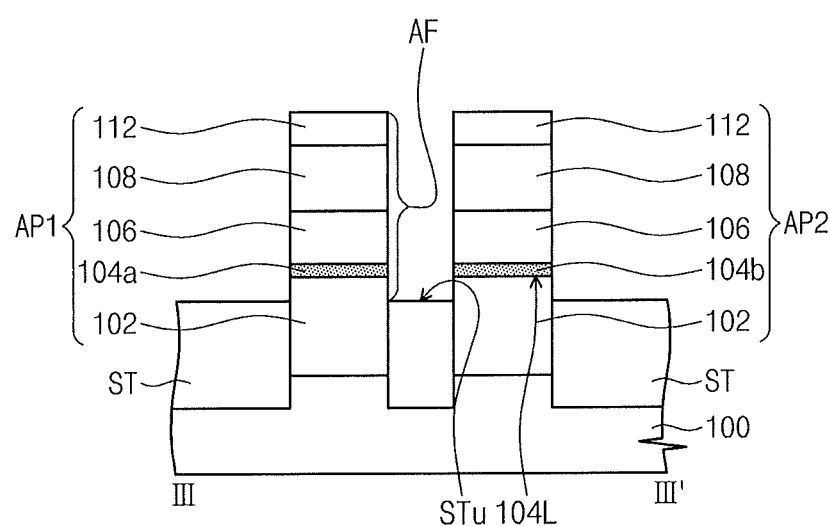
FIG. 14 is a cross-sectional view corresponding to the line III-III' of FIG. 13A to illustrate a method of forming a semiconductor device according to a modified embodiment of a second embodiment of the inventive concepts.

Referring to FIGS. 13A and 13B, the barrier layer 132, the channel layer 128, the second buffer layer 126, the graphene layer 124 including the first and second doped regions r1 and r2, and the first buffer layer 122 may be sequentially patterned to form active patterns AP1 and AP2 on the substrate 100. An upper portion of the substrate 100 may be recessed during the patterning process. During the patterning process, the graphene layer 124 may be patterned to form a first doped pattern 104a including the first doped region r1 and a second doped pattern 104b including the second doped region r2, for example. The active patterns AP1 and AP2 may include a first active pattern AP1, including the first doped pattern 104a, and a second active pattern AP2, including the second doped pattern 104b.

Each of the active patterns AP1 and AP2 may include a first buffer pattern 102, a second buffer pattern 106, a channel pattern 108, and a barrier pattern 112, which are sequentially stacked on the substrate 100. According to the present exemplary embodiment, the first active pattern AP1 may include the first doped pattern 104a disposed between the first and second buffer patterns 102 and 106 of the first active pattern AP1, and the second active pattern AP2 may include the second doped pattern 104b disposed between the first and second buffer patterns 102 and 106 of the second active pattern AP2.

A device isolation layer ST covering sidewalls of the active patterns AP1 and AP2 may be formed on the substrate 100. According to an exemplary embodiment, the sidewalls of the active patterns AP1 and AP2 may not be exposed by the device isolation layer ST, as illustrated in FIG. 13B. According to another exemplary embodiment, each of the active patterns AP1 and AP2 may include an upper portion (e.g., an active fin AF) exposed by the device isolation layer ST, as illustrated in FIG. 14. In such exemplary embodiments, a height of a top surface STu of the device isolation layer ST may be lower than a height of a bottom surface 104L of each of the first and second doped patterns 104a and 104b.

Referring again to FIGS. 9A, 9B, 9C, and 9D, a gate electrode GE intersecting the active patterns AP1 and AP2 may be formed on the substrate 100. The gate electrode GE may be provided on the active patterns AP1 and AP2 and may extend in the second direction D2. In an exemplary embodiment, the gate electrode GE may cover the top surfaces of the active patterns AP1 and AP2 and the top surface of the device isolation layer ST, as illustrated in FIG. 9D. In another exemplary embodiment, the gate electrode GE may cover the top surfaces and the exposed sidewalls of the active patterns AP1 and AP2 and may extend onto the top surface of the device isolation layer ST, as illustrated in FIG. 9E. A gate insulating pattern GI may be formed between the gate electrode GE and the active patterns AP1 and AP2. A capping pattern CAP may be formed on a top surface of the gate electrode GE, and gate spacers GS may be formed on both sidewalls of the gate electrode GE. In exemplary embodiments in accordance with principles of inventive concepts, the gate insulating pattern GI, the gate electrode GE, the capping pattern CAP, and the gate spacers GS may be formed by the substantially same method as described in the first embodiment with reference to FIGS. 1A to 1C. Thereafter, source/drain regions 110 may be formed in the active patterns AP1 and AP2 at both sides of the gate electrode GE.

Figure 15A:
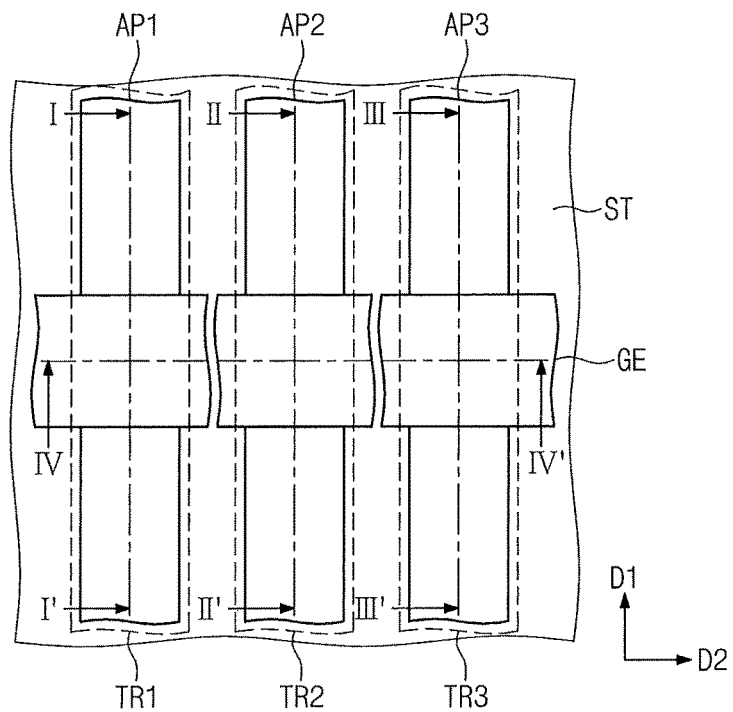
FIG. 15A is a plan view illustrating a semiconductor device according to a third embodiment of the inventive concepts.
Figure 15B:
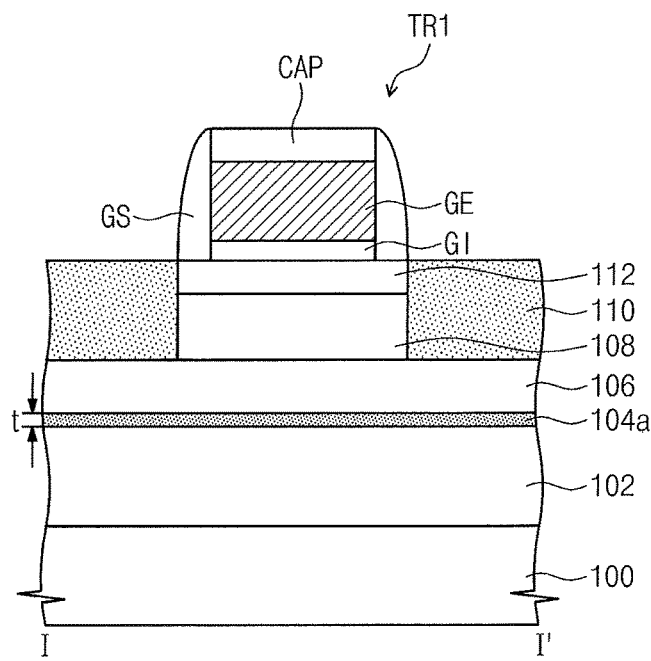
FIGS. 15B, 15C, 15D, and 15E are cross-sectional views taken along lines I-I', II-II', III-III', and IV-IV' of FIG. 15A, respectively.
Figure 15C:
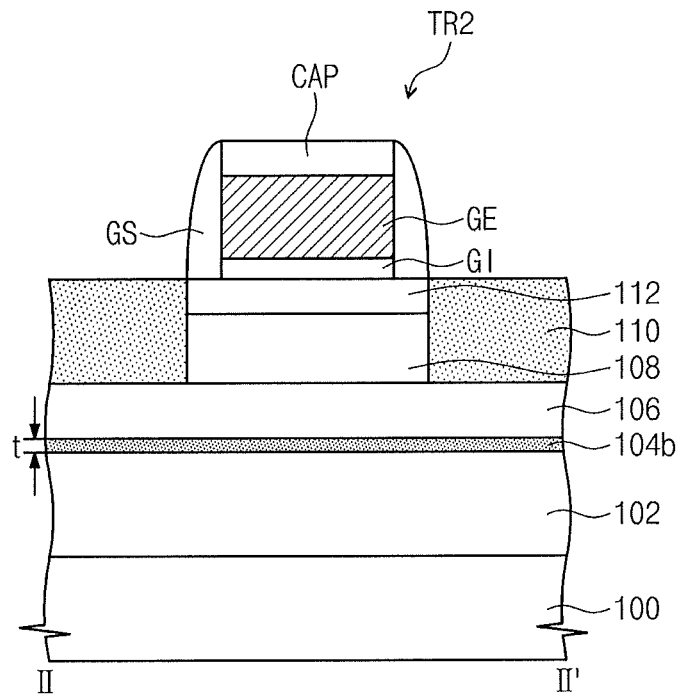
Figure 15D:
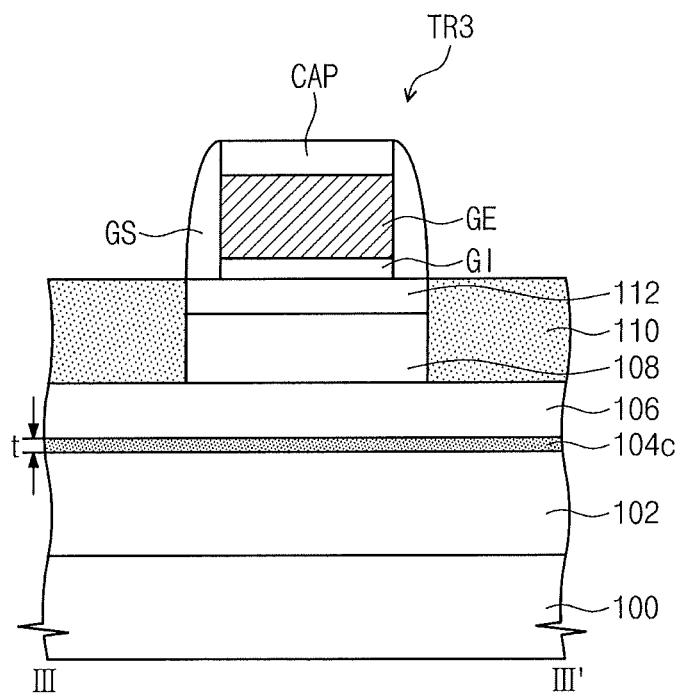

FIG. 15A is a plan view illustrating a semiconductor device according to a third exemplary embodiment in accordance with principles of inventive concepts. FIGS. 15B, 15C, 15D, and 15E are cross-sectional views taken along lines I-I', II-II', III-III', and IV-IV' of FIG. 15A, respectively. FIG. 15F is a cross-sectional view corresponding to the line IV-IV' of FIG. 15A to illustrate a semiconductor device according to a modified embodiment of a third exemplary embodiment in accordance with principles of inventive concepts. In the present exemplary embodiment, the same elements as described in the first embodiment of FIGS. 1A to 1C will be indicated by the same reference numerals or the same reference designators. For the purpose of ease and convenience in explanation, descriptions of the same elements as in the first embodiment will be omitted or only briefly described.

Referring to FIGS. 15A, 15B, 15C, 15D, and 15E, a device isolation layer ST defining a plurality of active patterns AP1, AP2, and AP3 may be provided on a substrate 100. The active patterns AP1, AP2, and AP3 may include a first active pattern AP1, a second active pattern AP2, and a third active pattern AP3 that are spaced apart from each other with the device isolation layer ST interposed therebetween. Each of the active patterns AP1, AP2, and AP3 may have a bar shape extending in a first direction D1. The active patterns AP1, AP2, and AP3 may be spaced apart from each other in a second direction D2 intersecting the first direction D1.

Each of the active patterns AP1, AP2, and AP3 may include a first buffer pattern 102 on the substrate 100, a channel pattern 108 on the first buffer pattern 102, and a second buffer pattern 106 between the first buffer pattern 102 and the channel pattern 108. According to an exemplary embodiment, each of the active patterns AP1, AP2, and AP3 may further include a barrier pattern 112 disposed on the channel pattern 108. In such exemplary embodiments, the channel pattern 108 may be disposed between the barrier pattern 112 and the second buffer pattern 106.

According to the present exemplary embodiment, the first active pattern AP1 may include a first doped pattern 104a disposed between the first and second buffer patterns 102 and 106 of the first active pattern AP1, and the second active pattern AP2 may include a second doped pattern 104b disposed between the first and second buffer patterns 102 and 106 of the second active pattern AP2. The third active pattern AP3 may include a third doped pattern 104c disposed between the first and second buffer patterns 102 and 106 of the third active pattern AP3.

Each of the first to third doped patterns 104a, 104b, and 104c may include graphene that is injected or doped with an impurity and may have a crystal structure formed by substituting the impurity for one or some of carbon atoms of the graphene. Each of the first to third doped patterns 104a, 104b, and 104c may have a thickness t of one atomic layer employing a two-dimensional crystal structure of the graphene. The thicknesses t of the first, second, and third doped patterns 104a, 104b, and 104c may be substantially equal to each other.

According to the present exemplary embodiment, the first to third doped patterns 104a, 104b, and 104c may have the same conductivity type, but impurity concentrations of the first to third doped patterns 104a, 104b, and 104c may be different from each other. In some embodiments, the first to third doped patterns 104a, 104b, and 104c may have a P-type, and the impurity concentrations of the first to third doped patterns 104a, 104b, and 104c may be different from each other. In such exemplary embodiments, the impurity may include, for example, boron. In other exemplary embodiments, the first to third doped patterns 104a, 104b, and 104c may have an N-type, and the impurity concentrations of the first to third doped patterns 104a, 104b, and 104c may be different from each other. In such exemplary embodiments, the impurity may include, for example, halogen atoms such as nitrogen or fluorine.

In a cross-sectional view, each of the first to third doped patterns 104a, 104b, and 104c may be more adjacent, or closer, to the channel pattern 108 of each of the first to third active patterns AP1, AP2, and AP3 than to the substrate 100. Each of the first to third doped patterns 104a, 104b, and 104c may provide extra carriers to the channel pattern 108 of each of the first to third active patterns AP1, AP2, and AP3. In an exemplary embodiment, if the first to third doped patterns 104a, 104b, and 104c are P-type, each of the first to third doped patterns 104a, 104b, and 104c may provide extra holes to the channel pattern 108 of each of the first to third active patterns AP1, AP2, and AP3. In another exemplary embodiment, if the first to third doped patterns 104a, 104b, and 104c are N-type, each of the first to third doped patterns 104a, 104b, and 104c may provide extra electrons to the channel pattern 108 of each of the first to third active patterns AP1, AP2, and AP3.

The channel patterns 108 of the first to third active patterns AP1, AP2, and AP3 may be formed of the same material and may include silicon (Si), germanium (Ge), silicon-germanium (SiGe), or a III-V group compound, for example.

The first buffer patterns 102 of the first to third active patterns AP1, AP2, and AP3 may be formed of the same material, and the second buffer patterns 106 of the first to third active patterns AP1, AP2, and AP3 may be formed of the same material. In addition, the barrier patterns 112 of the first to third active patterns AP1, AP2, and AP3 may be formed of the same material.

In exemplary embodiments in accordance with principles of inventive concepts, each of the first to third active patterns AP1, AP2, and AP3, the channel pattern 108 may include a material of which an energy band gap is smaller than those of the second buffer pattern 106 and the barrier pattern 112. As a result, the channel pattern 108 may have a quantum well structure. In other exemplary embodiments, the barrier pattern 112 may be omitted in each of the active patterns AP1, AP2, and AP3.

Figure 15E:
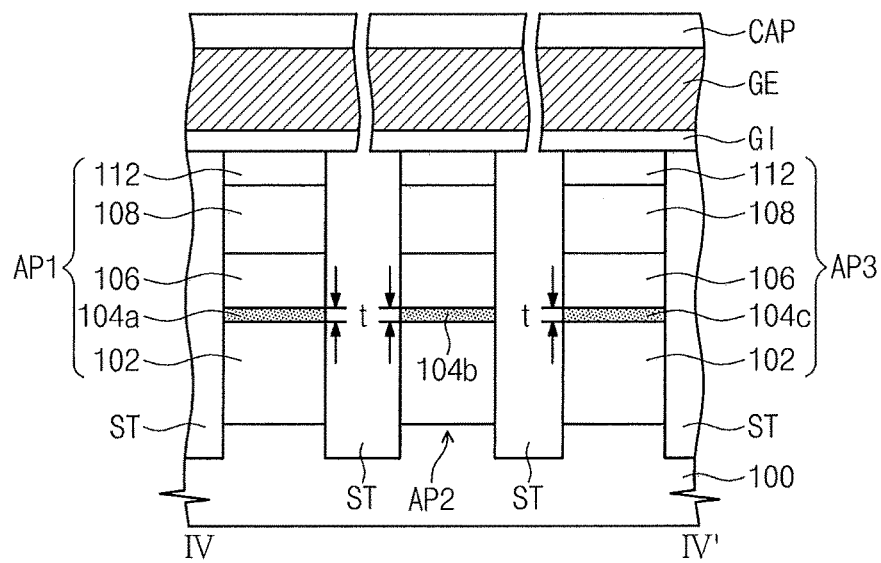
Figure 15F:
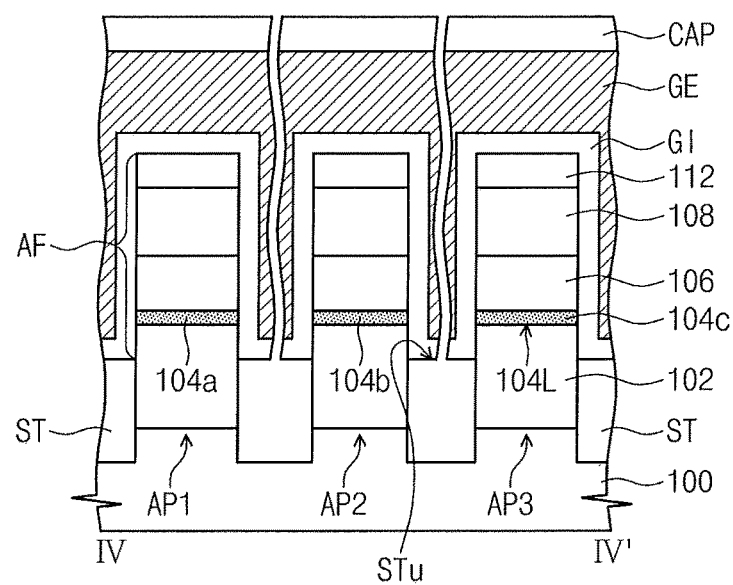
FIG. 15F is a cross-sectional view corresponding to the line IV-IV' of FIG. 15A to illustrate a semiconductor device according to a modified embodiment of a third embodiment of the inventive concepts.

According to an exemplary embodiment, both sidewalls of each of the active patterns AP1, AP2, and AP3 may not be exposed by the device isolation layer ST, as illustrated in FIG. 15E. Alternatively, each of the active patterns AP1, AP2, and AP3 may have an upper portion (e.g., an active fin AF) exposed by the device isolation layer ST, as illustrated in FIG. 15F. That is, in exemplary embodiments in accordance with principles of inventive concepts, upper portions of the both sidewalls of each of the active patterns AP1, AP2, and AP3 may be exposed by the device isolation layer ST.

In such exemplary embodiments, a height of a top surface STu of the device isolation layer ST may be lower than a height of a bottom surface 104L of each of the first to third doped patterns 104a, 104b, and 104c.

Gate electrodes GE may be provided to intersect the active patterns AP1, AP2, and AP3, respectively. According to an exemplary embodiment, a plurality of gate electrodes GE may be provided to intersect the plurality of active patterns AP1, AP2, and AP3, respectively, as illustrated in FIG. 15A. Alternatively, unlike FIG. 15A, one gate electrode GE intersecting the plurality of active patterns AP1, AP2, and AP3 may be provided on the substrate 100.

The gate electrodes GE may be provided on the active patterns AP1, AP2, and AP3 and may extend in the second direction D2. According to an exemplary embodiment, the gate electrodes GE may cover top surfaces of the active patterns AP1, AP2, and AP3 and a top surface of the device isolation layer ST, as illustrated in FIG. 15E. According to another exemplary embodiment, each of the gate electrodes GE may cover the top surface and the exposed sidewalls of each of the active patterns AP1, AP2, and AP3 and may extend onto the top surface of the device isolation layer ST, as illustrated in FIG. 15F. A gate insulating pattern GI may be provided between each of the gate electrodes GE and each of the active patterns AP1, AP2, and AP3. The gate insulating pattern GI may extend along a bottom surface of each of the gate electrodes GE in the second direction D2. A capping pattern CAP may be provided, or formed, on a top surface of each of the gate electrodes GE, and gate spacers GS may be provided on both sidewalls of each of the gate electrodes GE. Source/drain regions 110 may be provided in the active patterns AP1, AP2, and AP3 at both sides of each of the gate electrodes GE. As a result, a first transistor TR1, a second transistor TR2, and a third transistor TR3 may be realized, or implemented, on the substrate 100. The first transistor TR1 may include the first active pattern AP1, and the second transistor TR2 may include the second active pattern AP2. The third transistor TR3 may include the third active pattern AP3.

The first, second, and third transistors TR1, TR2, and TR3 may be field effect transistors that have the same conductivity type but have different threshold voltages from each other. In some exemplary embodiments, the first to third transistors TR1, TR2, and the TR3 may be PMOS field effect transistors having different threshold voltages from each other or NMOS field effect transistors having different threshold voltages from each other. According to the present exemplary embodiment, the first to third doped patterns 104a, 104b, and 104c may have the same conductivity type but the impurity concentration of the first to third doped patterns 104a, 104b, and 104c may be different from each other. As a result, the first to third transistors TR1, TR2, and TR3 respectively including the first to third doped patterns 104a, 104b, and 104c may have the same conductivity type but may have the different threshold voltages from each other.

FIGS. 16A to 20A are plan views illustrating a method of forming a semiconductor device according to a third exemplary embodiment in accordance with principles of inventive concepts. FIGS. 16B to 20B are cross-sectional views taken along lines I-I' and II-II' of FIGS. 16A to 20A, respectively. FIGS. 16C to 20C are cross-sectional views taken along lines III-III' and IV-IV' of FIGS. 16A to 20A, respectively. FIG. 21 is a cross-sectional view corresponding to the line IV-IV' of FIG. 20A to illustrate a method in accordance with principles of inventive concepts of forming a semiconductor device according to a modified embodiment of a third embodiment of the inventive concepts. In the present exemplary embodiment, the same elements as described in the formation method according to the first embodiment of FIGS. 2 to 5 will be indicated by the same reference numerals or the same reference designators. For the purpose of ease and convenience in explanation, the descriptions to the same elements as in the formation method of the first embodiment will be omitted or only briefly described.

A first buffer layer 122 may be first formed on a substrate 100, as described with reference to FIG. 2. The first buffer layer 122 may include silicon (Si), germanium (Ge), silicon-germanium (SiGe), or a III-V group compound. A graphene layer 124 may be provided on the first buffer layer 122. As described with reference to FIGS. 7A, 7B, and 7C, the graphene layer 124 may be formed on the first support substrate 200 and may be then provided onto, formed on, or transferred to the first buffer layer 122 by means of the transfer process.

Figure 16A:
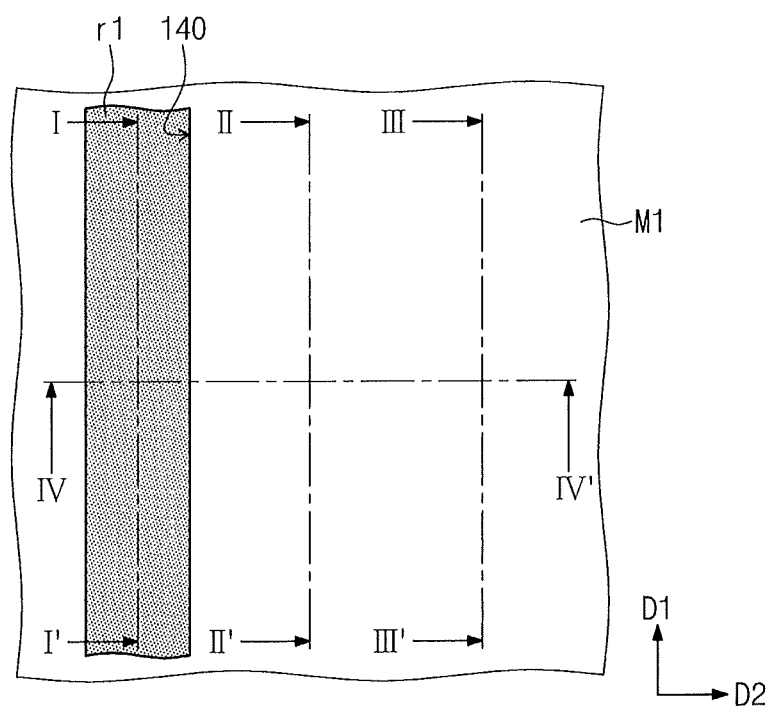

Referring to FIGS. 16A, 16B, and 16C, a first mask layer M1 may be formed on the graphene layer 124. The first mask layer M1 may be, for example, a photoresist layer. The first mask layer M1 may have a first opening 140 that exposes the graphene layer 124. The first opening 140 may extend in a first direction D1 and may expose a portion of a top surface of the graphene layer 124. The portion of the graphene layer 124 exposed by the first opening 140 may be doped with an impurity IM using the first mask layer M1 as a doping mask. In this manner, a first doped region r1 may be formed in the graphene layer 124. If the first doped region r1 has an N-type, the impurity IM may include, for example, halogen atoms such as nitrogen or fluorine. If the first doped region r1 has a P-type, the impurity IM may include, for example, boron. In some exemplary embodiments, doping the exposed portion of the graphene layer 124 with the impurity IM may include exposing the exposed portion of the graphene layer 124 to an arc discharge in a gas atmosphere including the impurity IM. In such exemplary embodiments, the impurity IM may be substituted for one or some of carbon atoms of the exposed portion of the graphene layer 124 to form the first doped region r1.

Figure 17A:
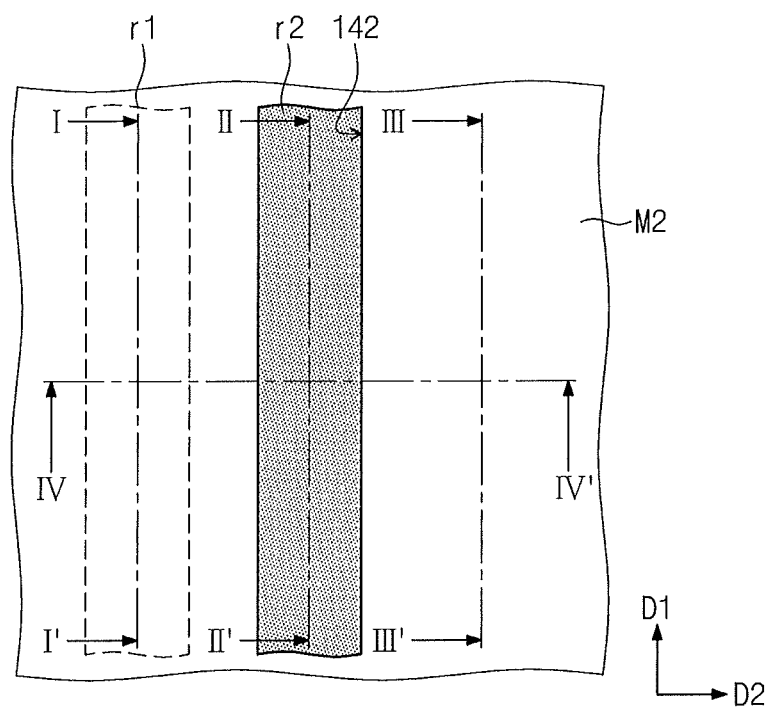

Referring to FIGS. 17A, 17B, and 17C, the first mask layer M1 may be removed after the formation of the first doped region r1. The first mask layer M1 may be removed by, for example, an ashing process and/or a strip process. Next, a second mask layer M2 may be formed on the graphene layer 124 including the first doped region r1. The second mask layer M2 may be a photoresist layer, for example. The second mask layer M2 may have a second opening 142 that exposes the graphene 124. The second opening 142 may extend in the first direction D1 and may expose a portion of the top surface of the graphene layer 124. The second opening 142 may be spaced apart from the first doped region r1 in a second direction D2 intersecting the first direction D1 when viewed from a plan view.

The portion of the graphene layer 124 exposed by the second opening 142 may be doped with an impurity IM using the second mask layer M2 as a doping mask. In such exemplary embodiments, a second doped region r2 may be formed in the graphene layer 124. The second doped region r2 may be spaced apart from the first doped region r1 in the second direction D2. If the second doped region r2 is N-type, the impurity IM may include, for example, halogen atoms such as nitrogen or fluorine. If the second doped region r2 is P-type, the impurity IM may include, for example, boron. In exemplary embodiments in accordance with principles of inventive concepts, second doped region r2 may have the same conductivity type as the first doped region r1, but an impurity concentration of the second doped region r2 may be different from an impurity concentration of the first doped region r1. Doping the portion, exposed by the second opening 142, of the graphene layer 124 with the impurity IM may be the same as described with reference to FIGS. 16A, 16B, and 16C, for example.

Figure 18A:
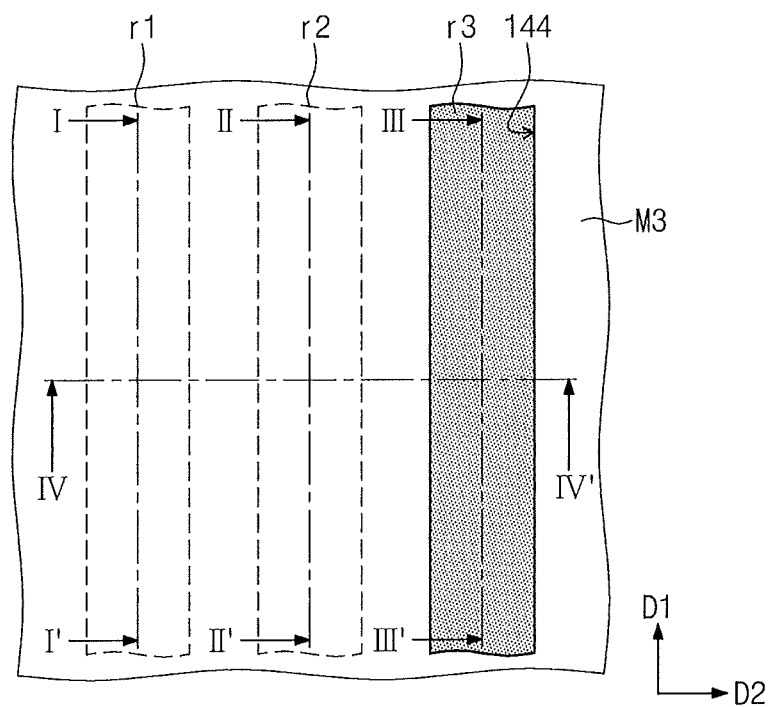

Referring to FIGS. 18A, 18B, and 18C, the second mask layer M2 may be removed after the formation of the second doped region r2. For example, the second mask layer M2 may be removed by an ashing process and/or a strip process. Thereafter, a third mask layer M3 may be formed on the graphene layer 124 including the first and second doped regions r1 and r2. The third mask layer M3 may be, for example, a photoresist layer. The third mask layer M3 may include a third opening 144 that exposes the graphene layer 124. The third opening 144 may extend in the first direction D1 and may be spaced apart from the first and second dope regions r1 and r2 in the second direction D2 when viewed from a plan view.

The portion of the graphene layer 124 exposed by the third opening 144 may be doped with an impurity IM using the third mask layer M3 as a doping mask. In this manner, a third doped region r3 may be formed in the graphene layer 124. The third doped region r3 may be spaced apart from the first doped region r1 and the second doped region r2 in the second direction D2. That is, in exemplary embodiments in accordance with principles of inventive concepts, the first doped region r1, the second doped region r2, and the third doped region r3 may be arranged along the second direction D2. If the third doped region r3 is N-type, the impurity IM may include, for example, halogen atoms such as nitrogen or fluorine. If the third doped region r3 is P-type, the impurity IM may include, for example, boron. The third doped region r3 may have the same conductivity type as the first doped region r1 and the second doped region r2. An impurity concentration of the third doped region r3 may be different from the impurity concentrations of the first and second doped regions r1 and r2. That is, in exemplary embodiments in accordance with principles of inventive concepts, the impurity concentrations of the first, second, and third doped regions r1, r2, and r3 may be different from each other. Doping the portion, exposed by the third opening 144, of the graphene layer 124 with the impurity IM may be the same as described with reference to FIGS. 16A, 16B, and 16C.

Figure 19A:
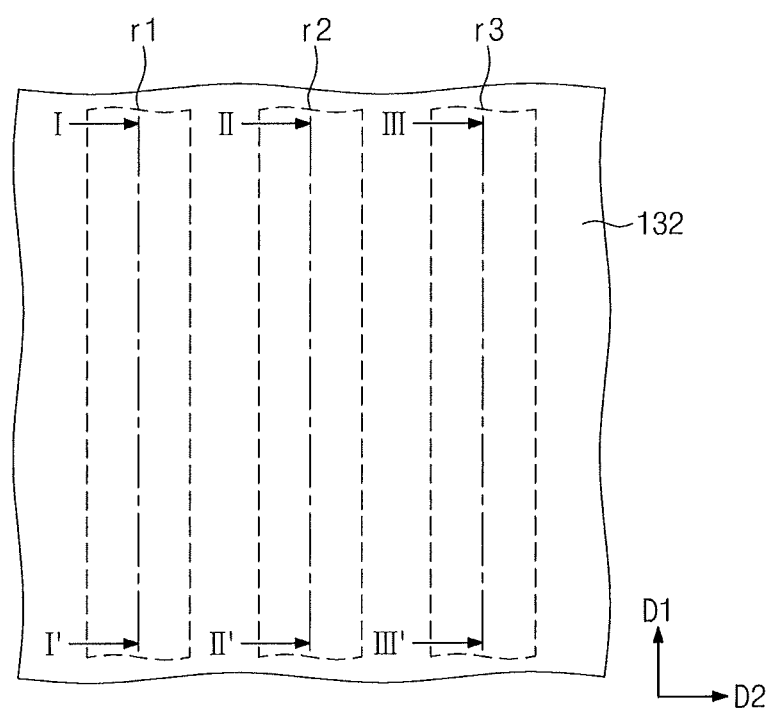

Referring to FIGS. 19A, 19B, and 19C, the third mask layer M3 may be removed after the formation of the third doped region r3. For example, the third mask layer M3 may be removed by an ashing process and/or a strip process. A second buffer layer 126, a channel layer 128, and a barrier layer 132 may be sequentially formed on the graphene layer 124 including the first, second, and third doped regions r1, r2, and r3.

The second buffer layer 126 may include the same material as the first buffer layer 122. The second buffer layer 126 may include silicon (Si), germanium (Ge), silicon-germanium (SiGe), or a III-V group compound, for example. According to an exemplary embodiment, the second buffer layer 126 may include the same material as the first buffer layer 122 and may have the same composition ratio as the first buffer layer 122. Alternatively, the second buffer layer 126 may include the same material as the first buffer layer 122, but the composition ratio of the second buffer layer 126 may be different from that of the first buffer layer 122. The second buffer layer 126 may be formed as described with reference to FIGS. 8A, 8B, and 8C.

The channel layer 128 may include a material of which an energy band gap is smaller than that of the second buffer layer 126. In some exemplary embodiments, the channel layer 128 may include a material of which an energy band gap is smaller than those of the first and second buffer layers 122 and 126. The channel layer 128 may include silicon (Si), germanium (Ge), silicon-germanium (SiGe), or a III-V group compound.

The barrier layer 132 may include a material of which an energy band gap is greater than that of the channel layer 128. That is, in exemplary embodiments, the channel layer 128 may include the material of which the energy band gap is smaller than those of the barrier layer 132 and the second buffer layer 126, so the channel layer 128 may have a quantum well structure. The barrier layer 132 may include silicon (Si), germanium (Ge), silicon-germanium (SiGe), or a III-V group compound. In other exemplary embodiments, forming the barrier layer 132 may be omitted.

The channel layer 128 and the barrier layer 132 may be formed as described with reference to FIG. 4.

Figure 20A:
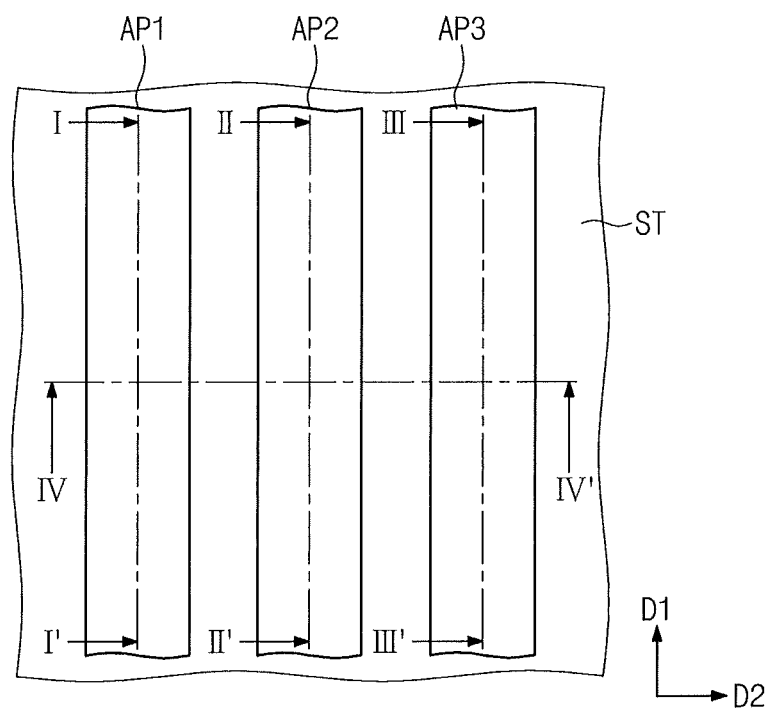
Figure 21:
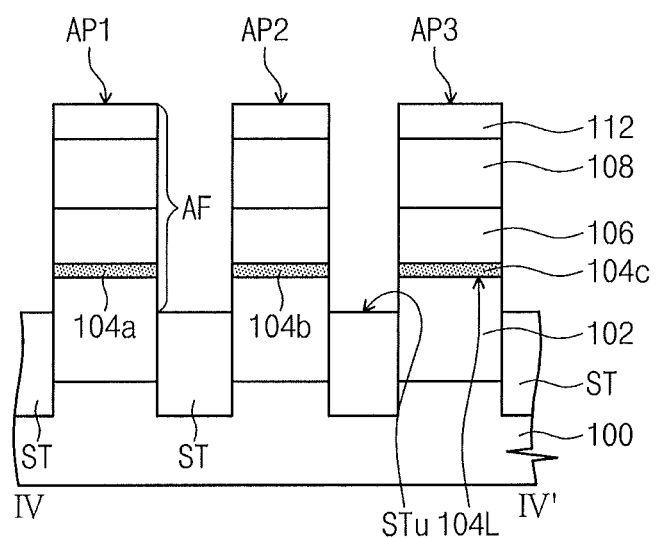
FIG. 21 is a cross-sectional view corresponding to the line IV-IV' of FIG. 20A to illustrate a method of forming a semiconductor device according to a modified embodiment of a third embodiment of the inventive concepts.

Referring to FIGS. 20A, 20B, and 20C, the barrier layer 132, the channel layer 128, the second buffer layer 126, the graphene layer 124 including the first to third doped regions r1, r2 and r3, and the first buffer layer 122 may be successively patterned to form active patterns AP1, AP2, and AP3 on the substrate 100. During the patterning process, an upper portion of the substrate 100 may be recessed. During the patterning process, the graphene layer 124 may be patterned to form a first doped pattern 104a including the first doped region r1, a second doped pattern 104b including the second doped region r2, and a third doped pattern 104c including the third doped region r3. The active patterns AP1, AP2, and AP3 may include a first active pattern AP1 including the first doped pattern 104a, a second active pattern AP2 including the second doped pattern 104b, and a third active pattern AP3 including the third doped pattern 104c.

Each of the active patterns AP1, AP2, and AP3 may include a first buffer pattern 102, a second buffer pattern 106, a channel pattern 108, and a barrier pattern 112 that are sequentially stacked on the substrate 100. According to the present exemplary embodiment, the first active pattern AP1 may include the first doped pattern 104a disposed between the first and second buffer patterns 102 and 106 of the first active pattern AP1, and the second active pattern AP2 may include the second doped pattern 104b disposed between the first and second buffer patterns 102 and 106 of the second active pattern AP2. The third active pattern AP3 may include the third doped pattern 104c disposed between the first and second buffer patterns 102 and 106 of the third active pattern AP3.

A device isolation layer ST covering sidewalls of the active patterns AP1, AP2, and AP3 may be formed on the substrate 100. According to an exemplary embodiment, the sidewalls of the active patterns AP1, AP2, and AP3 may not be exposed by the device isolation layer ST, as illustrated in FIG. 20C. According to another exemplary embodiment, each of the active patterns AP1, AP2, and AP3 may include an upper portion (e.g., an active fin AF) exposed by the device isolation layer ST, as illustrated in FIG. 21. In such exemplary embodiments, a height of a top surface STu of the device isolation layer ST may be lower than a height of a bottom surface 104L of each of the first to third doped patterns 104a, 104b, and 104c.

Referring again to FIGS. 15A to 15E, gate electrodes GE may be formed to intersect active patterns AP1, AP2, and AP3. The gate electrodes GE may be provided on the active patterns AP1, AP2, and AP3 and may extend in the second direction D2. In an exemplary embodiment, the gate electrodes GE may cover the top surfaces of the active patterns AP1, AP2, and AP3 and the top surface of the device isolation layer ST, as illustrated in FIG. 15E. In another exemplary embodiment, each of the gate electrodes GE may cover the top surface and the exposed sidewalls of each of the active patterns AP1, AP2, and AP3 and may extend onto the top surface of the device isolation layer ST, as illustrated in FIG. 15F. A gate insulating pattern GI may be formed between each of the gate electrodes GE and each of the active patterns AP1, AP2, and AP3. A capping pattern CAP may be formed on a top surface of each of the gate electrodes GE, and gate spacers GS may be formed on both sidewalls of each of the gate electrodes GE. The gate insulating pattern GI, the gate electrodes GE, the capping patterns CAP, and the gate spacers GS may be formed by the substantially same method as described in the first embodiment with reference to FIGS. 1A to 1C. Thereafter, source/drain regions 110 may be formed in each of the active patterns AP1, AP2, and AP3 at both sides of each of the gate electrodes GE.

FIGS. 22A to 26A are plan views illustrating a method of forming a semiconductor device according to a fourth exemplary embodiment in accordance with principles of inventive concepts. FIGS. 22B to 26B are cross-sectional views taken along lines I-I' of FIGS. 22A to 26A, respectively. In the present exemplary embodiment, the same elements as described in the formation method according to the first embodiment of FIGS. 2 to 5 will be indicated by the same reference numerals or the same reference designators. For the purpose of ease and convenience in explanation, the descriptions to the same elements as in the formation method of the first embodiment will be omitted or only briefly described.

As described with reference to FIG. 2, the first buffer layer 122 may be first formed on the substrate 100. The first buffer layer 122 may include silicon (Si), germanium (Ge), silicon-germanium (SiGe), or a III-V group compound. A graphene layer 124 may be provided on the first buffer layer 122. As described with reference to FIGS. 7A, 7B, and 7C, the graphene layer 124 may be formed on the first support substrate 200 and may be then provided onto the first buffer layer 122 by means of the transfer process.

Figure 22A:
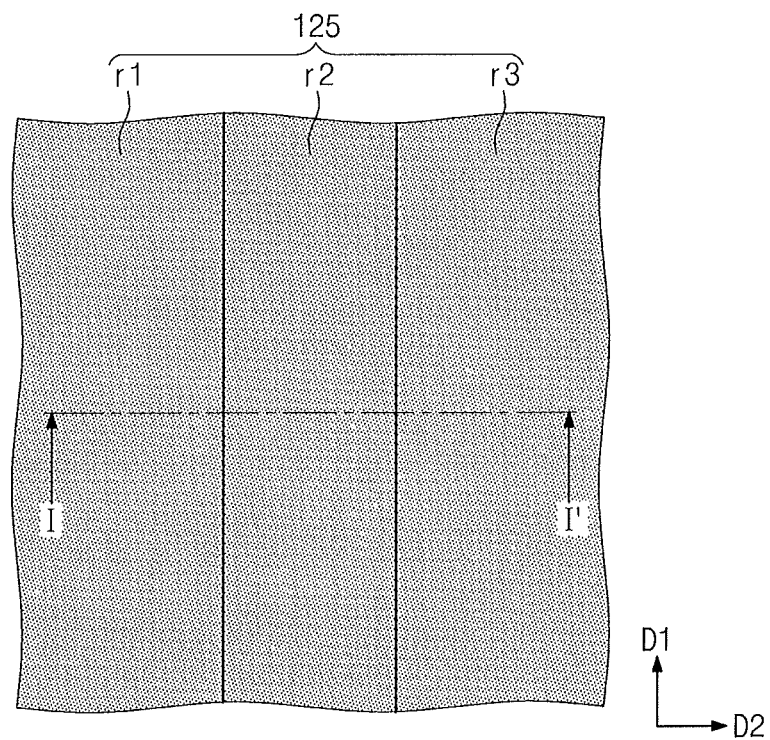
Figure 22B:
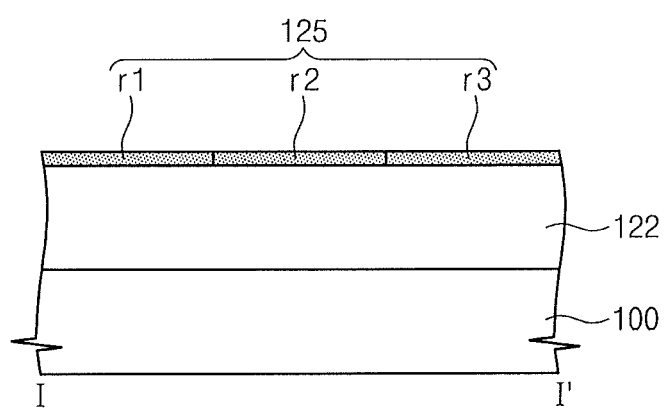

Referring to FIGS. 22A and 22B, the graphene layer 124 may be doped with an impurity IM to form a doped graphene layer 125. The doped graphene layer 125 may include a plurality of doped regions r1, r2, and r3. For example, the doped regions r1, r2, and r3 may extend in a first direction D1 and may be arranged along a second direction D2 intersecting the first direction D1. In some exemplary embodiments, a conductivity type of at least one of the doped regions r1, r2, and r3 may be different from those of the others of the doped regions r1, r2, and r3. In other exemplary embodiments, the doped regions r1, r2, and r3 may have the same conductivity type, but an impurity concentration of at least one of the doped regions r1, r2, and r3 may be different from those of the others of the doped regions r1, r2, and r3. In still other exemplary embodiments, the doped regions r1, r2, and r3 may have the same conductivity type and the same impurity concentration.

Figure 23A:
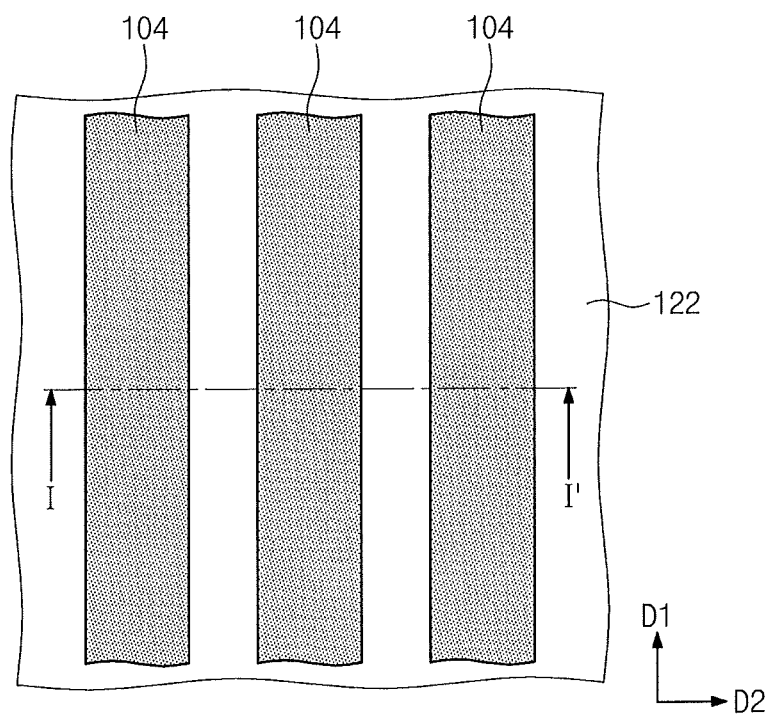
Figure 23B:
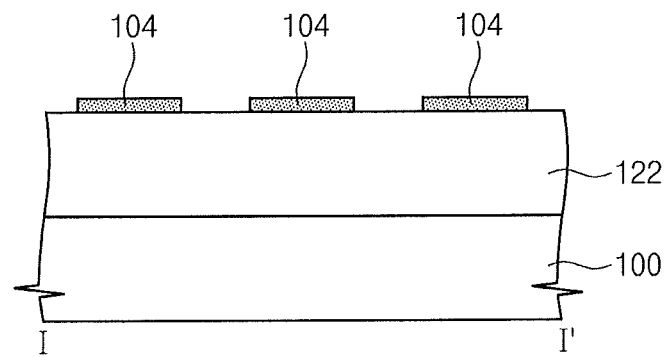

Referring to FIGS. 23A and 23B, the doped graphene layer 125 may be patterned to form a plurality of doped patterns 104. In an exemplary embodiment, mask patterns (not shown) defining the doped patterns 104 may be formed on the doped graphene layer 125, and an etching process may be performed on the doped graphene layer 125 using the mask patterns as an etch mask to form the doped patterns 104. The first buffer layer 122 between the doped patterns 104 may be exposed by the patterning process.

The doped patterns 104 may have bar shapes extending in the first direction D1 and may be arranged in the second direction D2 and may be spaced apart from each other. According to an exemplary embodiment, a conductivity type of at least one of the doped patterns 104 may be different from those of the others of the doped patterns 104. According to another exemplary embodiment, the doped patterns 104 may have the same conductivity type, but the impurity concentration of at least one of the doped patterns 104 may be different from those of the others of the doped patterns 104. According to still another exemplary embodiment, the doped patterns 104 may have the same conductivity type and the same impurity concentration.

Figure 24A:
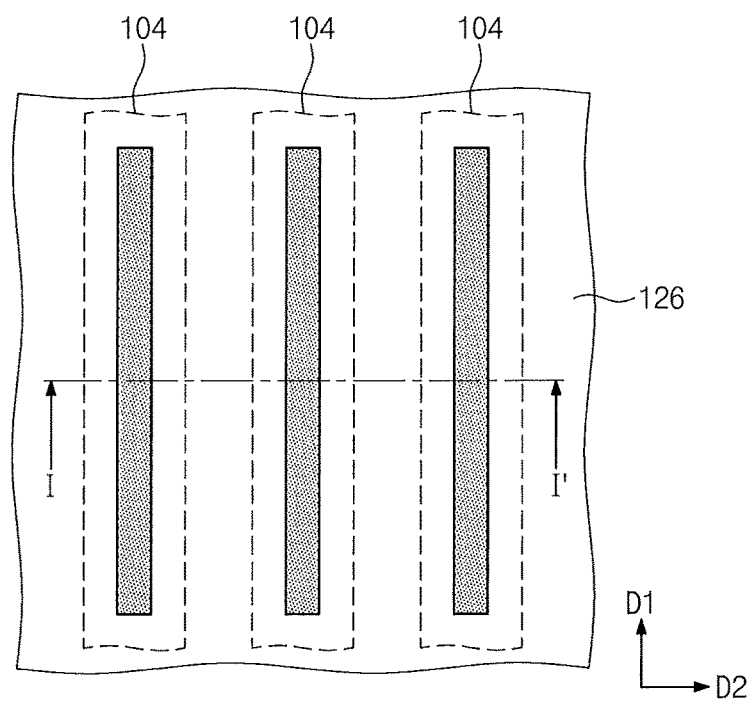
Figure 24B:
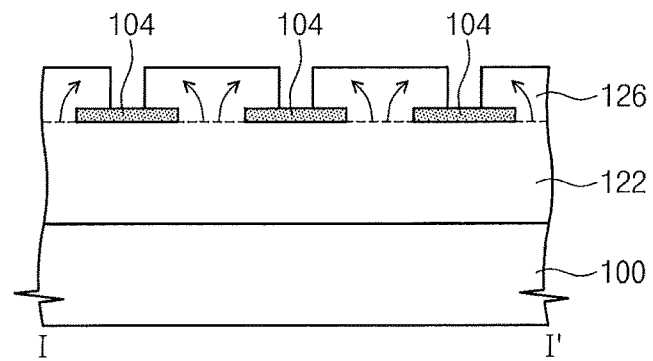

Referring to FIGS. 24A and 24B, a second buffer layer 126 may be formed on the first buffer layer 122. The second buffer layer 126 may fill spaces between the doped patterns 104 and may extend onto top surfaces of the doped patterns 104. According to the present exemplary embodiment, the second buffer layer 126 may be formed by performing a selective epitaxial growth (SEG) process using the first buffer layer 122 exposed by the doped patterns 104 as a seed. The second buffer layer 126 may be grown in a direction parallel to a top surface of the substrate 100 during the SEG process, so the second buffer layer 126 may cover the top surfaces of the doped patterns 104. The second buffer layer 126 may include silicon (Si), germanium (Ge), silicon-germanium (SiGe), or a III-V group compound, for example.

Figure 25A:
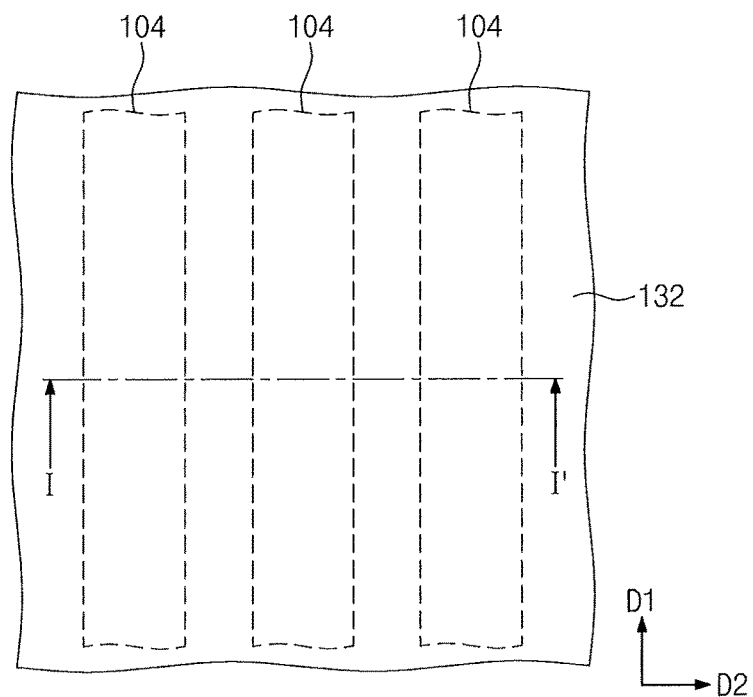
Figure 25B:
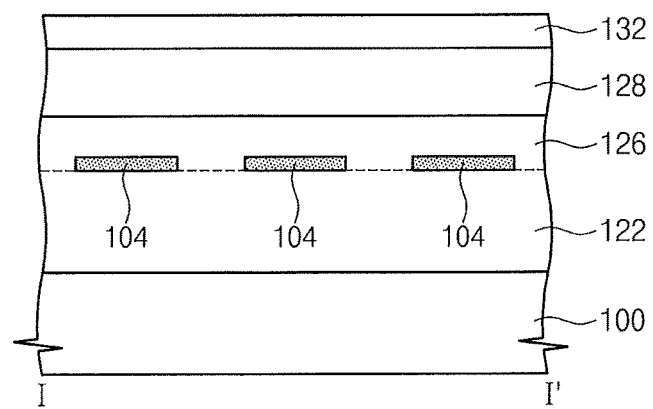

Referring to FIGS. 25A and 25B, the SEG process may be performed until the second buffer layer 126 completely covers the top surfaces of the doped patterns 104, so the doped patterns 104 may be buried under the second buffer layer 126. Thereafter, a channel layer 128 and a barrier layer 132 may be sequentially formed on the second buffer layer 126.

The channel layer 128 may include a material of which an energy band gap is smaller than that of the second buffer layer 126. In some embodiments, the channel layer 128 may include a material of which an energy band gap is smaller than those of the first and second buffer layers 122 and 126. The channel layer 128 may include silicon (Si), germanium (Ge), silicon-germanium (SiGe), or a III-V group compound.

The barrier layer 132 may include a material of which an energy band gap is greater than that of the channel layer 128. That is, the channel layer 128 may include the material of which the energy band gap is smaller than those of the barrier layer 132 and the second buffer layer 126. As a result, in accordance with principles of inventive concepts, the channel layer 128 may have a quantum well structure. The barrier layer 132 may include silicon (Si), germanium (Ge), silicon-germanium (SiGe), or a III-V group compound. In other exemplary embodiments, forming the barrier layer 132 may be omitted.

Figure 26A:
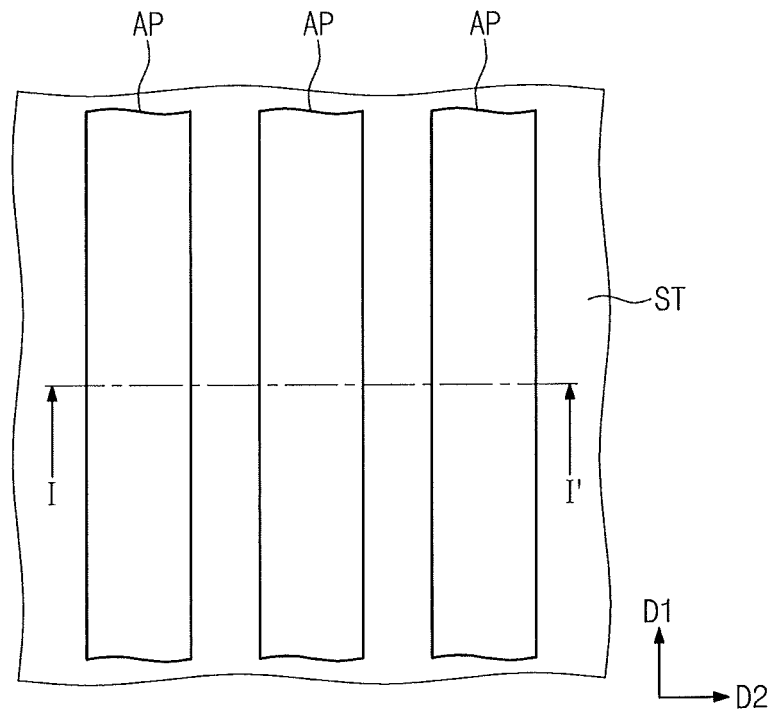
Figure 26B:
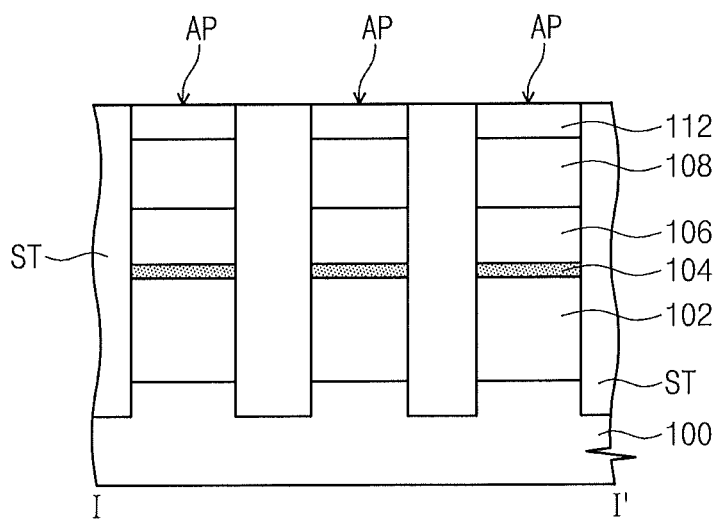

Referring to FIGS. 26A and 26B, the barrier layer 132, the channel layer 128, the second buffer layer 126, and the first buffer layer 122 may be successively patterned to form active patterns AP on the substrate 100. During the patterning process, the second buffer layer 126 disposed between the doped patterns 104 may be etched but the doped patterns 104 may not be etched. As a result, each of the active patterns AP may include each of the doped patterns 104. That is, in exemplary embodiments in accordance with principles of inventive concepts, each of the active patterns AP may include a first buffer pattern 102, the doped pattern 104, a second buffer pattern 106, a channel pattern 108, and a barrier pattern 112 which are sequentially stacked on the substrate 100.

A device isolation layer ST may be formed on the substrate 100 to cover sidewalls of the active patterns AP. Next, subsequent processes may be performed. The subsequent processes of the present embodiment may be the substantially same as the formation processes described with reference to FIGS. 1A to 1C, 9A to 9D, and 15A to 15E.

According to exemplary embodiments of inventive concepts, extra carriers may be provided to the channel pattern using the doped pattern that is formed of the graphene doped with the impurity, and, in accordance with principles of inventive concepts, the electrical conductivity of the channel pattern may be increased to improve the operating characteristic of the transistor. In addition, the doped pattern may have the thickness of one atomic layer by the two-dimensional crystal structure of the graphene, so the characteristic dispersion of the transistor may be improved. Furthermore, heat generated from the transistor including the doped pattern may be easily dissipated by the high thermal conductivity of the graphene.

In addition, the graphene layer may be formed to include doped regions that are injected with impurities having different conductivity types from each other, or which are injected with the impurities having the same conductivity type but different impurity concentrations from each other. Thereafter, the graphene layer may be patterned to form the doped patterns which have different conductivity types from each other, or which have the same conductivity type and different impurity concentrations from each other. As a result, the semiconductor components (e.g., the field effect transistors) including the same channel material and having the different conductivity types from each other may be easily realized using the doped patterns, or the semiconductor components including the same channel material and having the different threshold voltages from each other may be easily realized using the doped patterns.

Figure 27:
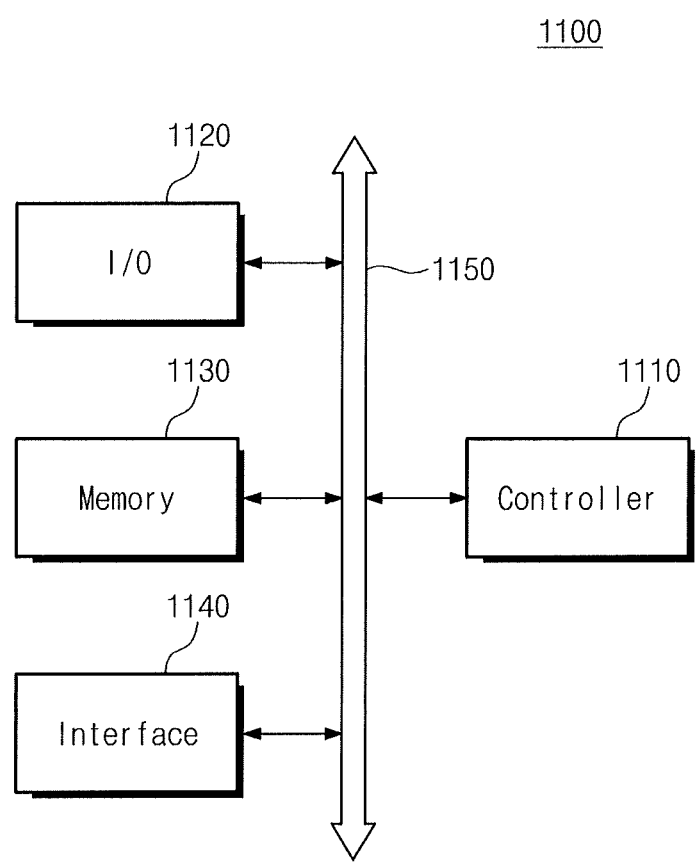
FIG. 27 is a schematic block diagram illustrating an electronic system including a semiconductor device according to exemplary embodiments in accordance with principles of inventive concepts.

FIG. 27 is a schematic block diagram illustrating an electronic system including a semiconductor device in accordance with principles of inventive concepts.

Referring to FIG. 27, an electronic system 1100 according to an exemplary embodiment of inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical data are transmitted.

The controller 1110 may include at least one of a microprocessor, a digital signal processor, a microcontroller, or another logic device having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate with or without a wired connection. For example, the interface unit 1140 may include an antenna for wireless communication or a transceiver for cable (or wired) communication. Although not shown in the drawings, the electronic system 1100 may further include a fast dynamic random access memory (DRAM) device and/or a fast static random access memory (SRAM) device which acts as a cache memory for improving an operation of the controller 1110. At least one semiconductor device in accordance with principles of inventive concepts may be provided in the memory device 1130 or may be provided to the controller 1110 and/or the I/O unit 1120.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

According to exemplary embodiments in accordance with principles of inventive concepts, extra carriers may be provided to a channel pattern using a doped pattern formed of graphene injected or implanted with an impurity. In this manner, in accordance with principles of inventive concepts, the electrical conductivity of the channel pattern may be increased to improve the operating characteristic of a field effect transistor. In addition, the doped pattern may have the thickness of one atomic layer by the two-dimensional crystal structure of the graphene, so the characteristic dispersion of the field effect transistor may be improved. Furthermore, heat generated from the transistor including the doped pattern may be easily dissipated by the high thermal conductivity property of the graphene.

In addition, in accordance with principles of inventive concepts, the graphene layer may be formed to include doped regions that are injected with impurities having different conductivity types from each other, or which are injected with impurities having the same conductivity type but different impurity concentrations from each other. Thereafter, the graphene layer may be patterned to form the doped patterns which have different conductivity types from each other, or which have the same conductivity type and different impurity concentrations from each other. As a result, the semiconductor components (e.g., the field effect transistors) including the same channel material and having the different conductivity types from each other may be easily realized using the doped patterns, or the semiconductor components including the same channel material and having different threshold voltages from each other may be easily realized using the doped patterns.

While inventive concepts have been described with reference to exemplary embodiments, it will be apparent to those skilled in the art that various changes and modifications may be made without departing from the spirit and scope of inventive concepts. Therefore, it should be understood that the above embodiments are not limiting, but illustrative and the scope of inventive concepts are to be determined by the broadest permissible interpretation of the following claims and their equivalents, and shall not be restricted or limited by the foregoing description.

What is claimed is:

1. A semiconductor device comprising:
   a first active pattern and a second active pattern spaced apart from each other on a substrate;
   a first transistor and a second transistor comprising the first active pattern and the second active pattern, respectively; and
   a device isolation layer provided on the substrate to define the first and second active patterns,
   wherein each of the first and second active patterns comprises:
   a first buffer pattern on the substrate;
   a channel pattern on the first buffer pattern;
   a doped pattern between the first buffer pattern and the channel pattern; and
   a second buffer pattern between the doped pattern and the channel pattern,
   wherein the doped pattern includes graphene injected with an impurity,
   wherein each of the first active pattern and the second active pattern has an active fin exposed by the device isolation layer, and
   wherein each of the first transistor and the second transistor comprises a gate electrode, the gate electrode covering a top surface and side surfaces of the active fin of each of the first active pattern and the second active pattern and extending onto a top surface of the device isolation layer.

2. The semiconductor device of claim 1, wherein a conductivity type of the doped pattern of the first active pattern is different from that of the doped pattern of the second active pattern.

3. The semiconductor device of claim 2, wherein the channel pattern of the first active pattern includes the same material as the channel pattern of the second active pattern.

4. The semiconductor device of claim 3, wherein the channel patterns of the first and second active patterns include a III-V group compound.

5. The semiconductor device of claim 3, wherein the doped pattern of the first active pattern is a P-type when the first transistor is a PMOS field effect transistor, and
   wherein the doped pattern of the second active pattern is an N-type when the second transistor is an NMOS field effect transistor.

6. The semiconductor device of claim 1, wherein the doped pattern of the first active pattern has the same conductivity type as the doped pattern of the second active pattern, and
   wherein an impurity concentration of the doped pattern of the first active pattern is different from an impurity concentration of the doped pattern of the second active pattern.

7. The semiconductor device of claim 6, wherein the channel pattern of the first active pattern includes the same material as the channel pattern of the second active pattern.

8. The semiconductor device of claim 7, wherein the channel patterns of the first and second active patterns include a III-V group compound.

9. The semiconductor device of claim 7, wherein the first transistor has the same conductivity type as the second transistor, and
   wherein a threshold voltage of the first transistor is different from a threshold voltage of the second transistor.

10. The semiconductor device of claim 1, wherein the doped pattern provides extra carriers to the channel pattern.

11. The semiconductor device of claim 1, wherein a height of the top surface of the device isolation layer is lower than a height of a bottom surface of the doped pattern.

12. The semiconductor device of claim 1,
    wherein a bottom surface of the device isolation layer is lower than bottom surfaces of the first buffer patterns of the first and second active patterns.

13. The semiconductor device of claim 1, wherein each of the first and second active patterns further comprises: a barrier pattern on the channel pattern,
    wherein the channel pattern is disposed between the second buffer pattern and the barrier pattern, and
    wherein the channel pattern includes a material of which an energy band gap is smaller than those of the second buffer pattern and the barrier pattern.

14. The semiconductor device of claim 1, wherein each of the first transistor and the second transistor further comprises a gate insulation layer between the gate electrode and the active fin of each of the first active pattern and the second active pattern.

* * * * *